(12) United States Patent
Futase et al.

(10) Patent No.: US 11,758,831 B2
(45) Date of Patent: *Sep. 12, 2023

(54) LOW RESISTANCE MULTI-LAYER ELECTRODE FOR PHASE CHANGE MEMORY AND METHODS OF MAKING THE SAME

(71) Applicant: Western Digital Technologies, Inc., San Jose, CA (US)

(72) Inventors: Takuya Futase, Nagoya (JP); Takashi Kobayashi, Yokkaichi (JP)

(*) Notice: Subject to any disclaimer, the term of this patent is extended or adjusted under 35 U.S.C. 154(b) by 501 days.

This patent is subject to a terminal disclaimer.

(21) Appl. No.: 17/078,351

(22) Filed: Oct. 23, 2020

(65) Prior Publication Data

US 2021/0336136 A1    Oct. 28, 2021

Related U.S. Application Data

(63) Continuation-in-part of application No. 16/857,053, filed on Apr. 23, 2020.

(51) Int. Cl.
| | | |
|---|---|---|
| *G11C 11/00* | (2006.01) | |
| *H10N 70/00* | (2023.01) | |
| *H10B 63/00* | (2023.01) | |
| *H10N 70/20* | (2023.01) | |

(52) U.S. Cl.
CPC ......... *H10N 70/841* (2023.02); *H10B 63/24* (2023.02); *H10B 63/80* (2023.02); *H10N 70/063* (2023.02); *H10N 70/231* (2023.02); *H10N 70/8828* (2023.02)

(58) Field of Classification Search
CPC .............................. H10N 70/231; H10B 63/80
See application file for complete search history.

(56) References Cited

U.S. PATENT DOCUMENTS

| | | | |
|---|---|---|---|
| 8,110,457 B2 | 2/2012 | Futase | |
| 8,679,961 B2 | 3/2014 | Ikeda | |
| 2009/0011566 A1 | 1/2009 | Okada et al. | |
| 2011/0237061 A1 | 9/2011 | Yamaguchi et al. | |
| 2012/0126297 A1* | 5/2012 | Yamaguchi | H01L 21/6875 257/E21.409 |

OTHER PUBLICATIONS

Office Action dated Feb. 2, 2023 in U.S. Appl. No. 17/460,651.

(Continued)

*Primary Examiner* — Mounir S Amer

(57) ABSTRACT

This disclosure relates to a low-resistance a multi-layer electrode and method of making a multi-layer electrode. Silicon is deposited on a substrate to form a top silicon layer. Nickel is deposited onto the top silicon layer to form a nickel layer. The substrate is annealed for a first time period and at a first temperature to form a di-nickel silicide layer with a remainder silicon layer between the di-nickel silicide layer and the substrate. Unreacted nickel of the nickel layer is removed to expose the di-nickel silicide layer. The substrate is annealed for a second time period and at a second temperature to form a nickel monosilicide layer from the di-nickel silicide layer and the remainder silicon layer such that the nickel monosilicide layer forms between a remainder di-nickel silicide layer and the substrate. The remainder di-nickel silicide layer and nickel monosilicide layer form a multi-layer electrode.

19 Claims, 10 Drawing Sheets

(56) References Cited

OTHER PUBLICATIONS

Notice of Allowance and Fee(s) Due dated May 18, 2023 in U.S. Appl. No. 17/460,651.
K. L. Lin, et al., "Nickel silicide for interconnects," IEEE IITC 2015, p. 169.
Notice of Allowance and Fee(s) Due dated Jun. 29, 2021 in U.S. Appl. No. 16/857,053.
Requirement for Restriction dated May 4, 2021 in U.S. Appl. No. 16/857,053.
Response to Requirement for Restriction filed May 24, 2021 in U.S. Appl. No. 16/857,053.
U.S. Appl. No. 17/460,651, filed Aug. 30, 2021.

* cited by examiner

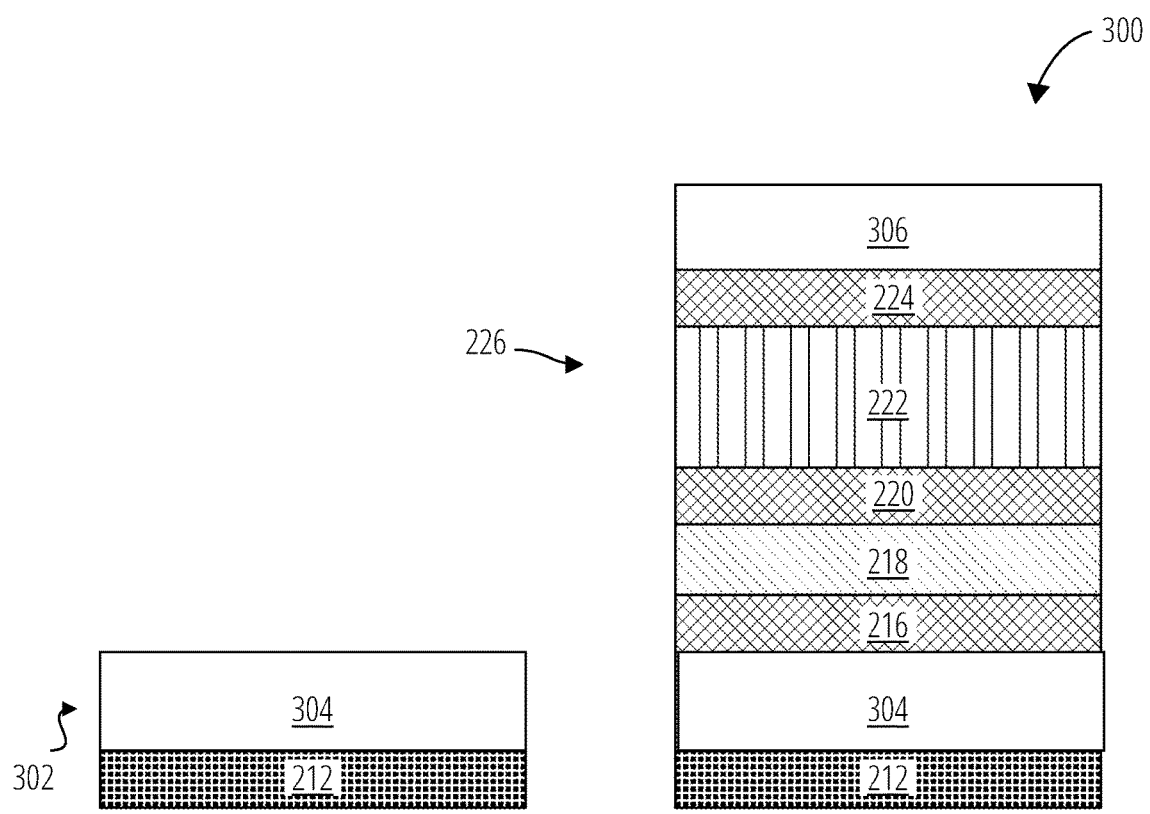
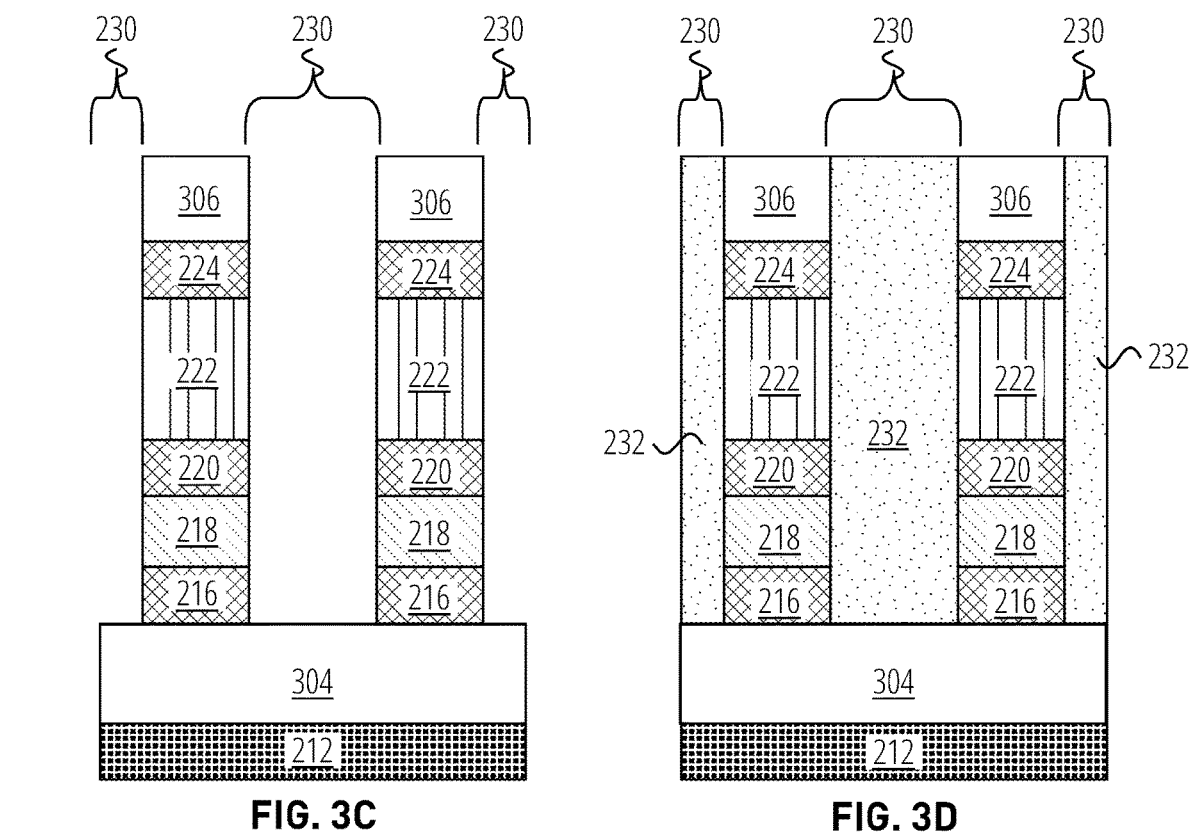

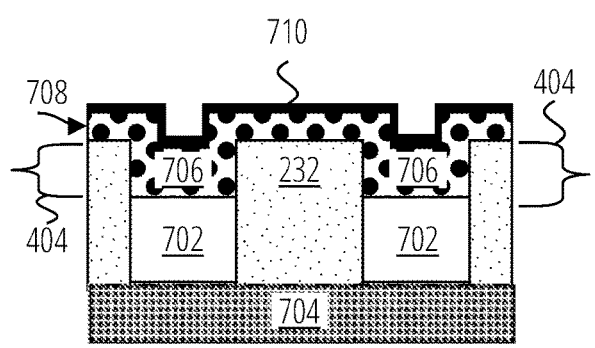 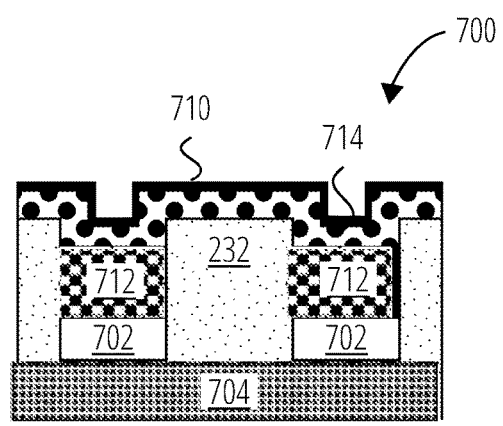
FIG. 7A  FIG. 7B
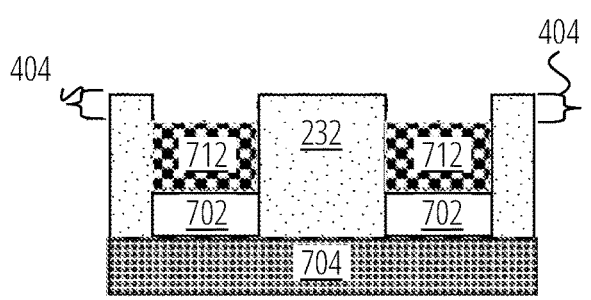 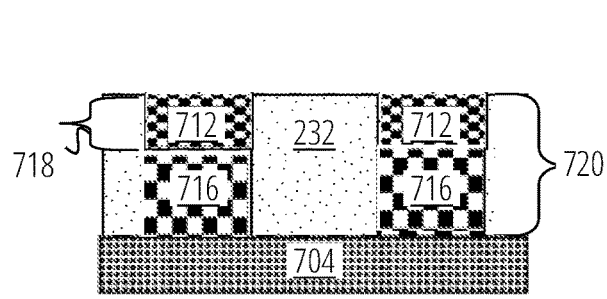
FIG. 7C  FIG. 7D

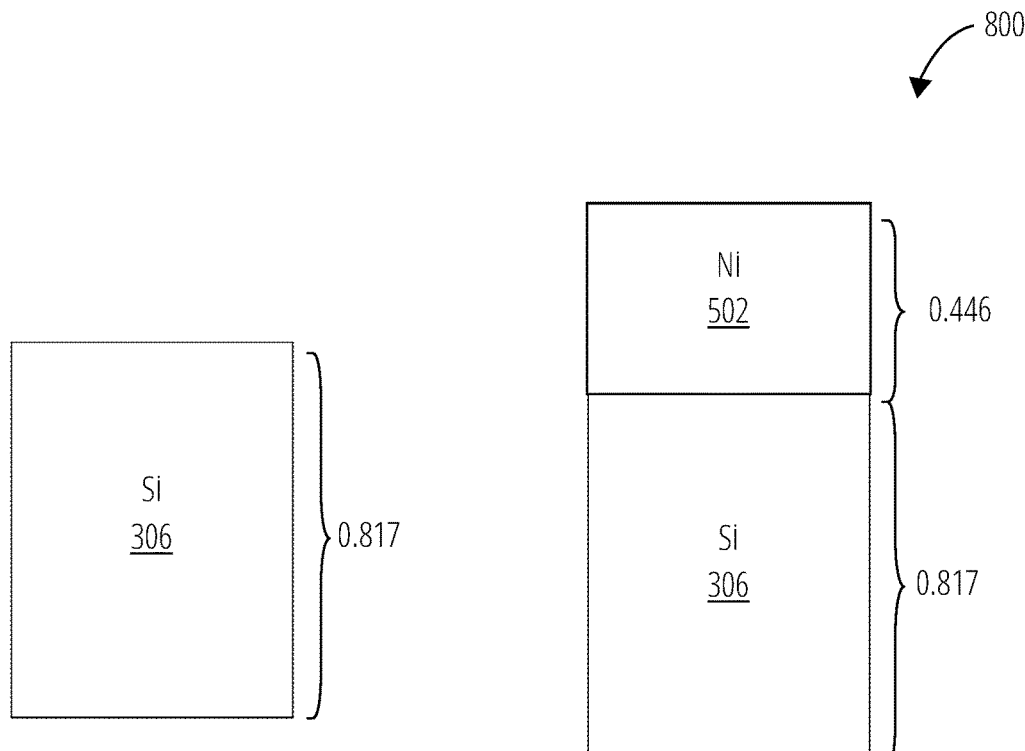
FIG. 8A
FIG. 8B
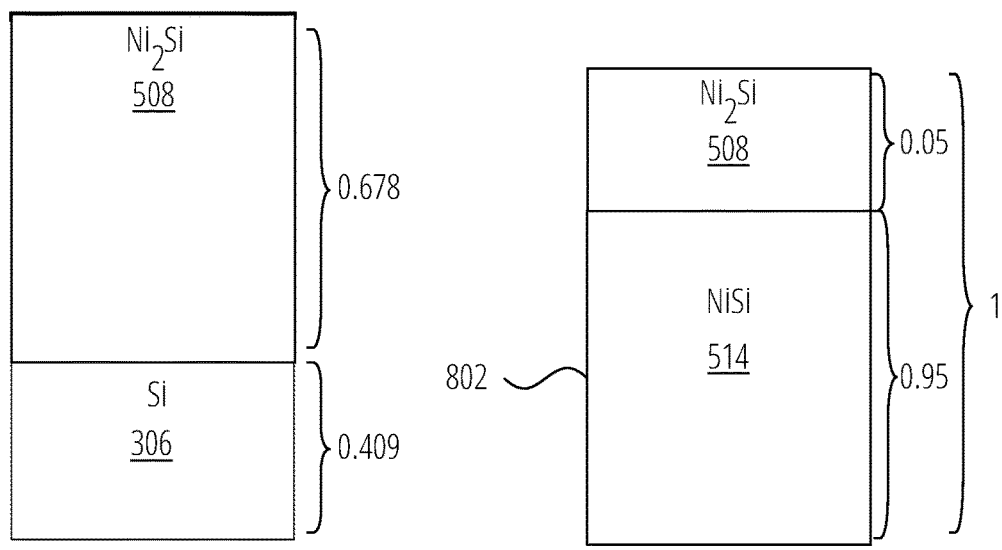
FIG. 8C
FIG. 8D

LOW RESISTANCE MULTI-LAYER ELECTRODE FOR PHASE CHANGE MEMORY AND METHODS OF MAKING THE SAME

CROSS REFERENCE TO RELATED PATENT APPLICATIONS

This application is a continuation-in-part, claims priority to, and is related to U.S. patent application Ser. No. 16/857,053, LOW RESISTANCE MONOSILICIDE FOR PHASE CHANGE MEMORY AND METHODS OF MAKING THE SAME, filed Apr. 23, 2020, the entire contents of which is incorporated by reference herein for all purposes.

BACKGROUND

Narrow wire effect in conductive materials limits how small electrodes and wires on semiconductor devices may be created through conventional manufacturing techniques. Control signals intended for transmission on these electrodes and wires necessitate that conductor resistance be kept as low as possible to achieve the high signal speeds and low power consumption needed to implement ever smaller chip designs.

Resistance is a physical property of a conductor that relates to both the conductor's material composition and dimensions. For a given low-resistance material, such as a metal, two conductors of equal length and cross-sectional area may exhibit an equal resistance, while a conductor with a greater length and the same cross-sectional area, or one with the same length but a smaller cross-sectional area, may exhibit a higher resistance. Thus, the smaller cross-sectional areas needed to fit conductive paths into smaller chip designs may lead to increases in resistance. This increased resistance degrades a signal traversing the conductive path and results in more power dissipation across the path.

One potential solution is to anneal the electrode material. Annealing has the effect of consolidating small grains within the material into larger grains. This reduces the number of grain boundaries within the wire structure, thereby improving the conductivity and reducing the reflective and degradative effects that occur as signals traverse grain boundaries.

This is not practical, however, for certain materials such as tungsten (W), which is a common material used in electrodes for conventionally constructed semiconductor memory devices and/or memory arrays. To be effective, the annealing is done at very high temperatures for the particular material being used. Tungsten, as a metal with a very high melting point, needs to be annealed at temperatures above 850° C. However, such high temperatures are impractical in manufacturing semiconductors which contain ovonic threshold switch (OTS) layers, as OTS is not thermostable, and would be damaged or degraded by an annealing process suitable for tungsten.

An alternative material, nickel monosilicide (NiSi) may be used in place of tungsten. Nickel monosilicide has a low resistivity and a lower narrow wire effect than tungsten. Other metal silicides may also exhibit these properties. Metal silicide wires and electrodes may be fabricated by a process called silicidation, wherein adjacent regions of a suitable metal and silicon may chemically combine through a thermal solid-state reaction to form the metal silicide. However, methods for creating NiSi and other metal silicide wires using silicidation fabrication methods may result in agglomeration of the electrode or formation of nickel di-silicide ($NiSi_2$) which has higher resistivity than nickel monosilicide. "Agglomeration" refers to a characteristic of a thin film or thin film deposition structure, such as an electrode, for grains of material to separate from each other and/or group together in clumps along a length or across a surface of the structure.

There is, therefore, a need for methods of inducing and controlling silicidation as part of a fabrication process in order to create conductive metal silicide structures within a semiconductor design having mitigated, nominal, or eliminated agglomeration.

BRIEF SUMMARY

This disclosure relates to a low-resistance multi-layer electrode and method of making the multi-layer electrode. Silicon is deposited on a substrate to form a top silicon layer. Nickel is deposited onto the top silicon layer to form a nickel layer. The substrate is annealed for a first time period and at a first temperature to form a di-nickel silicide layer from the top silicon layer and the nickel layer such that a remainder silicon layer remains between the di-nickel silicide layer and the substrate. The nickel layer including unreacted nickel is removed by etching to expose the di-nickel silicide layer. Substantially all of the nickel may be etched from the nickel layer. The substrate is annealed for a second time period and at a second temperature to form a nickel monosilicide layer from the di-nickel silicide layer and the remainder silicon layer such that the nickel monosilicide layer forms between a remainder di-nickel silicide layer and the substrate. The remainder di-nickel silicide layer and nickel monosilicide layer form a low-resistance multi-layer electrode.

This disclosure relates further to another method of forming a multi-layer electrode. A cell film stack is first formed on a substrate of a wafer having a top silicon layer. A sacrificial layer is deposited onto the top silicon layer, and the cell film stack is etched into pillars. Dielectric is deposited to fill the gaps between the pillars. The wafer is planarized to expose a predefined thickness of the sacrificial layer. The sacrificial layer is then removed. Next, nickel is deposited to form a nickel layer. The wafer is annealed for a first time period and at a first temperature to form a di-nickel silicide layer above the top silicon layer. Wet etching is used to remove unreacted nickel of the nickel layer and expose the di-nickel silicide layer. In some embodiments, substantially all of the nickel layer is removed by the wet etching. Finally, the wafer is annealed to for a second time period and at a second temperature to form a nickel monosilicide layer between a cap layer of di-nickel silicide and the cell film stack. The nickel monosilicide layer and cap layer together form the multi-layer electrode.

Finally, this disclosure relates to a phase change memory device. The phase change memory device comprises a selector connected in series with a phase change storage cell and a word line. A bit line is connected in series to the phase change storage cell. One or more of the bit line and the word line comprise a multi-layer electrode. "Multi-layer electrode" refers to an electrode comprising more than one layer of electrically conductive material. In one embodiment, a multi-layer electrode may comprise a monosilicide layer (e.g., a nickel monosilicide) and one or more additional layers, including but not limited to silicide layer (e.g., a di-nickel silicide layer).

BRIEF DESCRIPTION OF THE SEVERAL VIEWS OF THE DRAWINGS

To easily identify the discussion of any particular element or act, the most significant digit or digits in a reference number refer to the figure number in which that element is first introduced. In addition, like elements are referred to by a common reference numeral to facilitate understanding. Where cross-sections are depicted and reference numerals are used, the same reference numeral used in different figures and/or embodiments represents a layer made from the same material as first defined and associated with that reference numeral. For clarity, certain layers in cross-sectional views may not have a reference numeral. In such instances, the fill pattern used for a particular layer matches the fill pattern used on a layer having a reference numeral and thus the two layers are both made from the same material or material compound.

FIG. 3A-FIG. 3D depict process cross-sectional wafer views 300 in accordance with one embodiment.

FIG. 7A-FIG. 7D depict process cross-sectional views 700 in accordance with the embodiment of FIG. 4A-FIG. 4D.

FIGS. 8A-D depict thickness ratios for thin film layers for forming a low resistance multi-layer electrode 1000 in accordance with one embodiment.

FIG. 8B depicts an aspect of the subject matter in accordance with one embodiment.

FIG. 8C depicts an aspect of the subject matter in accordance with one embodiment.

FIG. 8D depicts an aspect of the subject matter in accordance with one embodiment.

DETAILED DESCRIPTION

Aspects of the solution disclosed herein form metal silicide structures as part of an integrated semiconductor die or wafer fabrication process. Nickel, which may be used to create nickel monosilicide, may be selected based on the conductivity of NiSi and the relative low cost of nickel. However, other metals such as platinum, cobalt, and vanadium may also be used in the disclosed solution. Use of nickel in descriptive text and illustrations does not limit this solution to use of nickel.

NiSi and other materials may, then, be used to construct word lines, bit lines, control lines, and other signaling pathways within semiconductor or circuit such as a crosspoint phase charge memory (PCM) cell array. NiSi may provide structures with lower resistivity and greater flexibility and thermal and structural stress tolerance over the life of the device, even when used to implement very narrow wires. The germanium-antimony-tellurium (Ge—Sb—Te or SGT) structures within a PCM cell heat and cool, during operation, the multi-layer electrode is more pliable than convention metals, such as tungsten used as electrodes. Consequently, the use of multi-layer electrodes may reduce or eliminate a risk of breaks or shorts in the multi-layer electrode in comparison to tungsten electrodes of similar dimensions. In addition, the multi-layer electrode of the different embodiments claimed herein is configured to minimize, mitigate, and/or eliminate agglomeration of the fabricated multi-layer electrode while also providing a low resistivity.

Methods are disclosed for forming wires and electrodes from NiSi or other metal silicides. An annealing process may be used to form a metal silicide conductor at temperatures low enough to preserve the integrity of OTS structures within the wafer, which may not be possible with conventional materials such as tungsten. Generally, the methods and circuits used herein use known rapid thermal silicidation annealing processing which rapidly ramp up to a target annealing temperature for the predefined time period and rapidly ramp down from target annealing temperature once the predefined time period expires.

Figure 1:
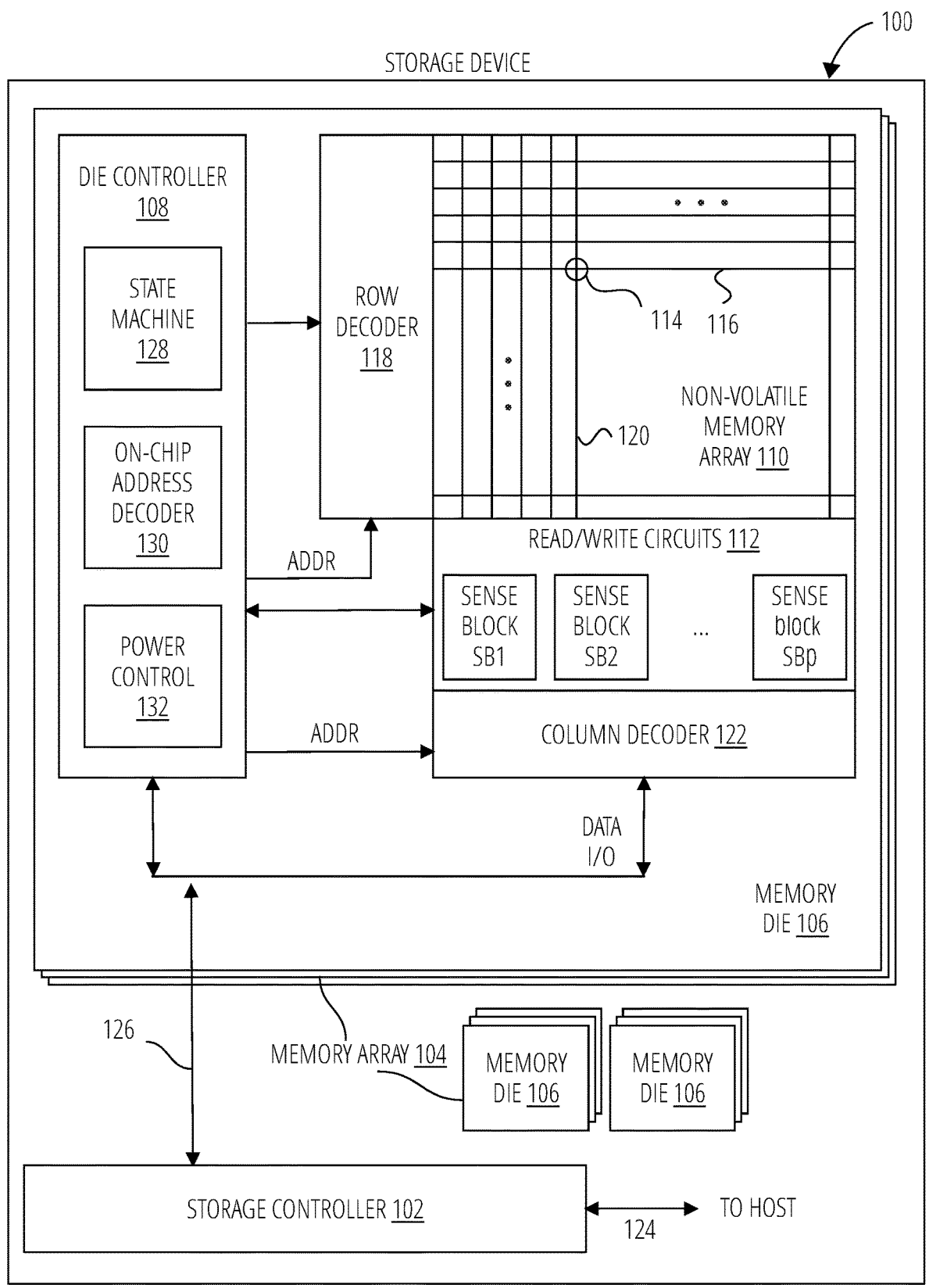
FIG. 1 depicts a storage device 100 in accordance with one embodiment.

FIG. 1 is a block diagram of an exemplary storage device 100. "Storage device" refers to any hardware, system, subsystem, circuit, component, module, non-volatile memory media, hard disk drive, storage array, device, or apparatus configured, programmed, designed, or engineered to store data for a period of time and retain the data in the storage device while the storage device is not using power from a power supply. "Non-volatile memory media" refers to any hardware, device, component, element, or circuit configured to maintain an alterable physical characteristic used to represent a binary value of zero or one after a primary power source is removed. Examples of the alterable physical characteristic include, but are not limited to, a threshold voltage for a transistor, an electrical resistance level of a memory cell, a current level through a memory cell, a magnetic pole orientation, a spin-transfer torque, and the like. Examples of storage devices include, but are not limited to, a hard disk drive, FLASH memory, MRAM memory, a Solid-State storage device, Just a Bunch Of Disks (JBOD), Just a Bunch Of Flash (JBOF), an external hard disk, an internal hard disk, and the like.

The storage device 100 may include a storage controller 102 and a memory array 104. Each memory die 106 in the memory array 104 may include a die controller 108, at least one non-volatile memory array 110 in the form of a three-dimensional array and read/write circuits 112.

"Non-volatile memory array" refers to a set of non-volatile storage cells (also referred to as memory cells or non-volatile memory cells) organized into an array structure having rows and columns. A memory array is addressable using a row identifier and a column identifier.

"Three-dimensional memory array" refers to a physical arrangement of components of a memory array which contrasts with a two-dimensional (2-D) memory array. 2-D memory arrays are formed along a planar surface of a semiconductor wafer or other substrate. A three-dimensional (3-D) memory array extends up from the wafer surface/substrate and generally includes stacks, or columns, of memory cells extending upwards, in a z-direction. In a 3-D memory array word lines comprise layers stacked one on the other as the memory array extends upwards. Various 3-D arrangements are possible. In one embodiment, a plurality of PCM memory cells may be stacked on each other to form a 3-D arrangement. In one arrangement a NAND string is formed vertically with one end (e.g., source) at the wafer surface and the other end (e.g., drain) on top.

"Threshold voltage" refers to a voltage level that when applied to a gate terminal of a transistor causes the transistor to conduct a current between the drain electrode and source electrode.

Consequently, a non-volatile memory array is a memory array having memory cells configured such that a characteristic (e.g., threshold voltage level, resistance level, conductivity, etc.) of the memory cell used to represent stored data remains a property of the memory cell without a requirement for using a power source to maintain the characteristic. "Memory cell" refers to a type of storage media configured to represent one or more binary values by way of a determinable physical characteristic of the storage media when the storage media is sensed, read, or detected to determine what binary value(s) was last stored in the memory cell. Memory cell and storage cell are used interchangeably herein.

A memory array is addressable using a row identifier and a column identifier. Those of skill in the art recognize that a memory array may comprise the set of memory cells within a plane, the set of memory cells within a memory die, the set of memory cells within a set of planes, the set of memory cells within a set of memory die, the set of memory cells within a memory package, the set of memory cells within a set of memory packages, or with other known memory cell set architectures and configurations.

A memory array may include a set of memory cells 114 at a number of levels of organization within a storage or memory system. In one embodiment, memory cells within a plane may be organized into a memory array. In one embodiment, memory cells within a plurality of planes of a memory die may be organized into a memory array. In one embodiment, memory cells within a plurality of memory dies of a memory device may be organized into a memory array. In one embodiment, memory cells within a plurality of memory devices of a storage system may be organized into a memory array.

The non-volatile memory array 110 is addressable by word line 116 via a row decoder 118 and by bit line 120 via a column decoder 122. "Word line" refers to a structure within a memory array comprising a set of memory cells. The memory array is configured such that the operational memory cells of the word line are read or sensed during a read operation. Similarly, the memory array is configured such that the operational memory cells of the word line are read, or sensed, during a read operation. A word line may also be referred to as a physical page or page for short. "Bit line" refers to a circuit structure configured to deliver a voltage and/or conduct current to a column of a memory array. In one embodiment, the column comprises a NAND string or memory string and may also be referred to as channel. In one embodiment, the column is referred to as a NAND string and the NAND string comprises a channel. In one embodiment, a bit line connects to a NAND string at a drain end or drain side of the NAND string. A memory array may have one bit line for each memory cell along the word lines of the memory arras.

"Select gate" refers to a transistor structurally and/or electrically configured to function as a switch to electrically connect a first electrical structure connected to a source terminal of the transistor to a second electrical structure connected to the drain terminal. When functioning as a switch, the transistor is referred to herein as a 'select gate' and serves to gate (selectively) or control when, and in what quantity, a current flows or a voltage passes between the first electrical structure and the second electrical structure. Depending on the context, references to select gate herein may refer to the whole transistor or to the gate terminal of the transistor.

The read/write circuits 112 include multiple sense blocks SB1, SB2, . . . , SBp (sensing circuitry) and allow a page of memory cells to be read or programmed in parallel. "Circuitry" refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment). In certain embodiments, each memory cell across a row of the memory array together form a physical page. "Read/write circuit" refers to a device, component, element, module, system, sub-system, circuitry, logic, hardware, or circuit configured and/or operational to read data from and write data to a storage media, such as storage cells of a storage array.

"Storage cell" refers to a type of storage media configured to represent one or more binary values by way of a determinable characteristic of the storage media when the storage media is sensed, read, or detected to determine a binary value(s) stored, or represented by, the determinable characteristic of the memory cell. Storage cell and memory cell are used interchangeably herein.

A physical page may include memory cells along a row of the memory array for a single plane or for a single memory die. In one embodiment, the memory die includes a memory array made up of two equal sized planes. In one embodiment, a physical page of one plane of a memory die includes four data blocks (e.g., 16 KB). In one embodiment, a physical page (also called a "die page") of a memory die includes two planes each having four data blocks (e.g., 32 KB). Commands and data are transferred between a host and storage controller 102 via a data bus 124, and between the storage controller 102 and the one or more memory dies 106 via bus 126.

The non-volatile memory array 110 can be two-dimensional (2D—laid out in a single fabrication plane) or three-dimensional (3D—laid out in multiple fabrication planes). The non-volatile memory array 110 may comprise one or more arrays of memory cells including a 3D array. In one embodiment, the non-volatile memory array 110 may comprise a monolithic three-dimensional memory structure (3D array) in which multiple memory levels are formed above (and not in) a single substrate, such as a wafer, with no intervening substrates. The non-volatile memory array 110 may comprise any type of non-volatile memory and may be monolithically formed in one or more physical levels of arrays of memory cells having an active area disposed above a silicon substrate. The non-volatile memory array 110 may be in a non-volatile solid-state drive having circuitry associated with the operation of the memory cells, whether the associated circuitry is above or within the substrate.

Within the non-volatile memory array 110, word lines 116 may comprise sections of the layers containing memory cells, disposed in layers above the substrate. Multiple word lines 116 may be formed on single layer by means of trenches or other non-conductive isolating features. Bit lines 120 may comprise electrodes or wires running across one or more layers. Memory cells 114 may be formed at the intersection of a word line 116 layer with an orthogonal column structure connected to a bit line 120.

The die controller 108 cooperates with the read/write circuits 112 to perform memory operations on memory cells of the non-volatile memory array 110, and includes a state machine 128, an address decoder 130, and a power control 132. The state machine 128 provides chip-level control of memory operations. "Die controller" refers to a set of circuits, circuitry, logic, or components configured to manage the operation of a die. In one embodiment, the die controller is an integrated circuit. In another embodiment, the die controller is a combination of discrete components. In another embodiment, the die controller is a combination of one or more integrated circuits and one or more discrete components.

The address decoder 130 provides an address interface between that used by the host or a storage controller 102 to the hardware address used by the row decoder 118 and column decoder 122. The power control 132 controls the power and voltages supplied to the various control lines during memory operations. "Control line" refers to a structure, circuit, circuitry, and/or associated logic configured to convey an electrical current and/or voltage from a source to a destination. In certain embodiments, analog voltages, currents, biases, and/or digital signals supplied or discharged over a control line are used to control switches, select gates, and/or other electrical components. Certain control lines may have a specific name based on what parts of a circuit the control line controls or where the control line couples, or connects, to other circuits. Examples of named control lines include word lines, bit lines, source control lines, drain control lines, and the like. Examples of named control lines include word lines, bit lines, source control lines, drain control lines, and the like.

"Source control line" refers to a control line configured to operate a select gate (e.g., turn the select gate on, activate, and off, deactivate) for coupling a source side of a NAND string to a source line and/or another circuit. In one embodiment, a source control line couples a selector for a PCM memory cell to a control line, such as a word line or a bit line.

"Logic" refers to machine memory circuits, non-transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

The power control 132 and/or read/write circuits 112 can include drivers for word lines, source gate select (SGS) transistors, drain gate select (DGS) transistors, bit lines, substrates (in 2D memory structures), charge pumps, and source lines/word lines/bit lines or the like. In certain embodiments, the power control 132 may detect a sudden loss of power and take precautionary actions. The power control 132 may include various first voltage generators (e.g., the drivers) to generate the voltages described herein. The sense blocks can include bit line drivers and sense amplifiers in one approach.

In some implementations, some of the components can be combined. In various designs, one or more of the components (alone or in combination), other than non-volatile memory array 110, can be thought of as at least one control circuit or storage controller which is configured to perform the techniques described herein. For example, a control circuit may include any one of, or a combination of, die controller 108, state machine 128, address decoder 130, column decoder 122, power control 132, sense blocks SB1, SB2, . . . , SBp, read/write circuits 112, storage controller 102, and so forth.

In one embodiment, the host is a computing device (e.g., laptop, desktop, smartphone, tablet, digital camera) that includes one or more processors, one or more processor readable storage devices (RAM, ROM, FLASH memory, hard disk drive, solid state memory) that store processor readable code (e.g., software) for programming the storage controller 102 to perform the methods described herein. The host may also include additional system memory, one or more input/output interfaces and/or one or more input/output devices in communication with the one or more processors, as well as other components well known in the art.

Associated circuitry is typically involved in operation of the memory cells and for communication with the memory cells. As non-limiting examples, memory devices may have circuitry used for controlling and driving memory cells to accomplish functions such as programming and reading. This associated circuitry may be on the same substrate as the memory cells and/or on a separate substrate. For example, a storage controller for memory read-write operations may be located on a separate storage controller chip and/or on the same substrate as the memory cells.

One of skill in the art will recognize that the disclosed techniques and devices are not limited to the two-dimensional and three-dimensional exemplary structures described but covers all relevant memory structures within the spirit and scope of the technology as described herein and as understood by one of skill in the art.

Figure 2:
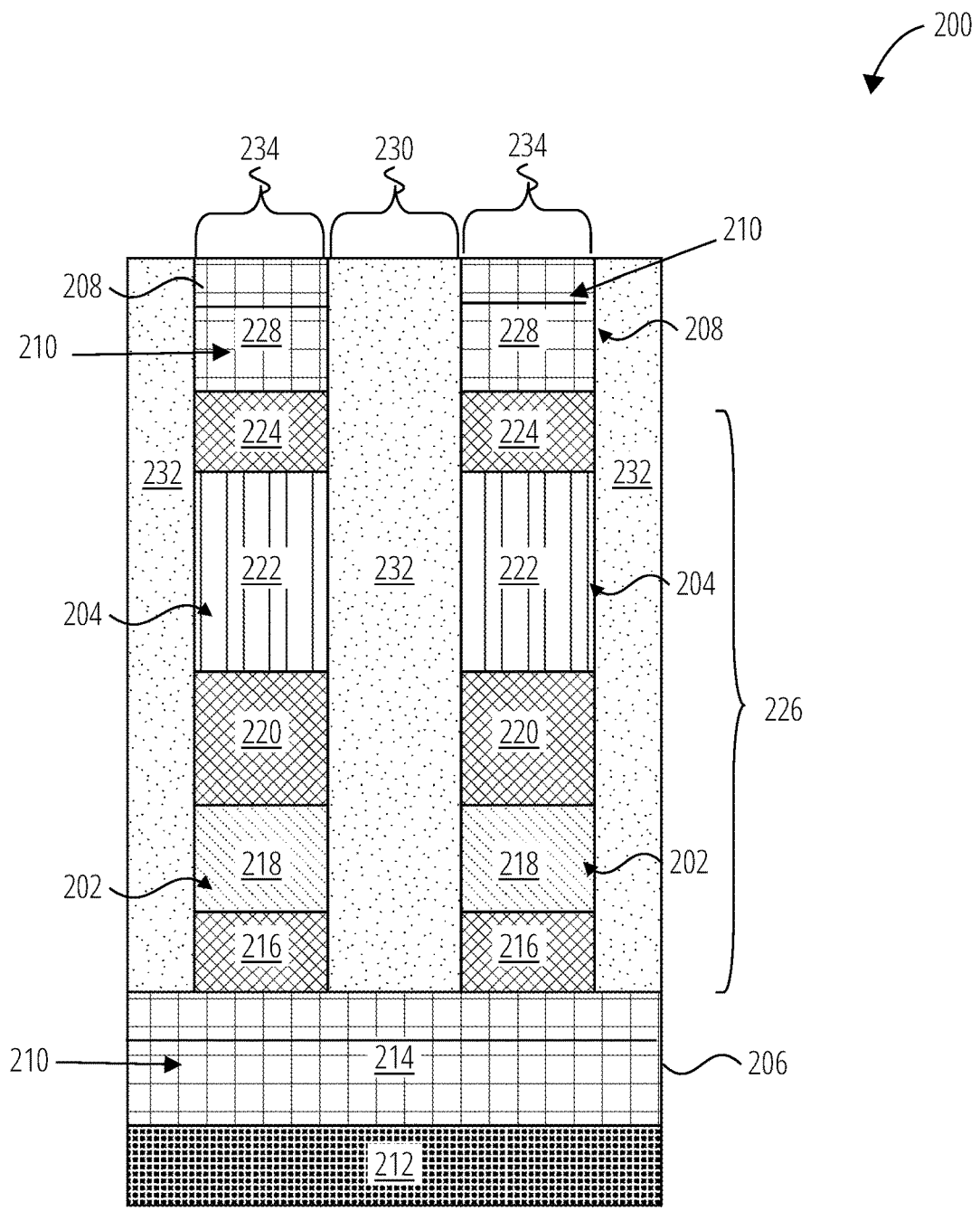
FIG. 2 depicts a cross-sectional view of a phase change storage cell 200 in accordance with one embodiment.

FIG. 2 depicts a cross-sectional view of a phase change storage cell 200 in accordance with one embodiment. The phase change storage cell may comprise a selector 202 and a phase change storage cell 204. The selector 202 is coupled to a word line 206 and the phase change storage cell 204 is coupled to a bit line 208. The word line 206, selector 202, phase change storage cell 204, and bit line 208 may be connected in series, in that order. In one embodiment, the bit line 208 and word line 206 may comprise multi-layer electrode 210 formed through the methods disclosed herein. "Multi-layer electrode" refers to an electrode comprising more than one layer of electrically conductive material. In one embodiment, a multi-layer electrode may comprise a monosilicide layer (e.g., a nickel monosilicide) and one or more additional layers, including but not limited to silicide layer (e.g., a di-nickel silicide layer). "Monosilicide" refers to a silicide comprising a single silicon atom per molecule or unit cell. A silicide is a compound of silicon and another element, usually a metal.

The selector 202 permits control of individual memory cells. "Selector" refers to a switch configured to control when a phase change storage cell receives current. In one embodiment, the selector is an ovonic threshold switch (OTS) which is a two-terminal symmetrical voltage sensitive switching device.

The elements comprising the cross-sectional view of a phase change storage cell 200 may be created by forming layers of different materials on a substrate 212, such as a semiconductor wafer. "Wafer" refers to a very thin slice of a semiconductor crystal used as the substrate for solid-state circuitry. "Substrate" refers to a material which provides a surface on which something is deposited or inscribed, for example the silicon wafer used to manufacture integrated circuits. In certain embodiments, a substrate may comprise a silicon wafer and in other embodiments, a substrate may comprise another layer of an integrated semiconductor, including, but not limited to, a top surface of a cell film stack, or the like.

A multi-layer metal monosilicide 214 (e.g., a multi-layer electrode) may be formed to provide a word line 206 multi-layer electrode 210, followed by a layer of carbon 216. In one embodiment, the multi-layer metal monosilicide 214 may consist of a compound formed by silicon (Si) and a single metal from a metal group consisting of nickel, cobalt, platinum, and vanadium. The carbon 216 layer may serve here, and elsewhere within the layer or cell film stack, to connect the structures formed by other layers in series. Thus, this layer of carbon 216 may act to connect the multi-layer metal monosilicide 214 of the word line 206 to the selector 202.

The selector 202 may be formed by depositing a layer of ovonic threshold switch 218 material over the layer of carbon 216. Another layer of carbon 220 may be deposited over the ovonic threshold switch 218 to connect the ovonic threshold switch 218 selector 202 to the phase change storage cell 204. The phase change storage cell 204 may be formed by depositing a layer of Ge—Sb—Te 222, which may be followed by another carbon 224 layer which may complete the cell film stack 226. Next, a second layer of one or more metal monosilicides 228 may be formed and serve as a bit line 208 type of multi-layer electrode 210. In one embodiment, the multi-layer electrodes forming word lines 206 and/or bit lines 208 of a non-volatile memory array 110 may have a resistance of between 0.6 and 2.5 mega-ohms per centimeter. "Mega-ohms per centimeter" refers to a unit of measure for electrical resistance in electrodes, terminals, control lines, or other very small structures.

In certain embodiments, the cell film stack 226, described above, may span a region larger than that depicted in FIG. 2, and be continuous in a direction into, or out of the page. FIG. 2 depicts a cell film stack 226 after formation of trenches 230 and filling of trenches 230 with a dielectric such as silicon oxide, SiO 232. "Cell film stack" refers to a multi-layer stack of two or more thin films configured to function as a storage cell (also referred to as a memory cell). In general, one or more terminals connect, or couple, to corresponding portions of the cell film stack to connect a single storage cell into a larger structure such as a non-volatile memory array which may be configured as a cross-point array.

To form a phase change storage cell, narrow vertical regions or pillars 234, comprising a small portion of each layer, may be formed by removing sections of the cell film stack 226 to create trenches 230 between the pillars 234. In order to maintain electrical isolation between the pillars 234 while implementing desired polarization effects for the operation of the phase change storage cell, the trenches 230 may be filled with a dielectric material such as SiO 232. "Dielectric" refers to an electrical insulator that can be polarized by an applied electric field. When a dielectric material is placed in an electric field, electric charges do not flow through the material as they do in an electrical conductor but slightly shift from their average equilibrium positions causing dielectric polarization.

"Phase change storage cell" refers to a two terminal storage cell comprising a chalcogenide material configured to provide a detectable electrical resistance when the chalcogenide material is in crystalline state and a distinguishable electrical resistance when the chalcogenide material is in an amorphous state. In certain embodiments, a phase change storage cell may include a heater for changing the state of the chalcogenide material. In another embodiment, electric current passing through the phase change storage cell sufficiently heats the chalcogenide material to cause the phase transition from crystalline to amorphous or vice versa.

In certain embodiments, the chalcogenide material may be a compound of Germanium, Antimony, and Tellurium $Ge_2Sb_2Te_5$ (GST). Those of skill in the art will recognize that other forms of chalcogenide material may be used with a phase change storage cell.

During programming of a phase change storage cell, the temperature in the phase change material (i.e., the GST) may reach a level that affects the material structure. The GST may thereby transition from an amorphous state to a crystalline state. At another temperature, the crystal structure may be disrupted, returning the material to an amorphous state. At or near a threshold voltage, the GST or other phase change material may exhibit switching characteristics. Below this threshold voltage, the GST may exhibit high resistance. Slightly above the threshold voltage, the GST may switch to a low-resistance, conductive state. At this point, a higher current flow may be possible, which may allow the material to reach a higher temperature more quickly. Once the temperature meets a melting threshold, the atoms may disarrange, making the material amorphous again. As the GST is expected to undergo thermal fluctuations, and these fluctuations may induce structural expansion and contraction in surrounding materials, the higher flexibility and ductility of monosilicides when compared to tungsten provides additional advantages to implementing the disclosed solution.

The cell film stack 226 formed on the substrate 212 and comprising carbon 216, ovonic threshold switch 218, and Ge—Sb—Te 222; and the multi-layer metal monosilicide 214 word line 206, multi-layer electrode bit line 208 as well as the pillars 234 and trenches 230, may be formed by a combination of conventional microfabrication techniques and the methods disclosed herein. "Microfabrication" refers to the process of fabricating miniature structures of micrometer scales and smaller. Microfabrication processes may be used for integrated circuit fabrication, also known as "semiconductor manufacturing," "semiconductor processing," "semiconductor process integration," or "semiconductor device fabrication".

A variety of processes for depositing, forming, growing, micro-forming, or adding structures and/or thin films of material to a substrate (e.g., additive material fabrication) and/or patterning, lithography, removing, etching, or dissolving of structures, and/or thin films of material from a substrate (e.g., selective material removal). Examples of such processes include, but are not limited to, deposition, etching, lithography, and the like.

In the last two decades, microelectromechanical systems (MEMS), microsystems (European usage), micromachines (Japanese terminology) and their subfields, microfluidics/lab-on-a-chip, optical MEMS (also called MOEMS), RF MEMS, PowerMEMS, BioMEMS and their extension into nanoscale (for example NEMS, for nano electro mechanical systems) have re-used, adapted or extended microfabrication methods. Microfabrication techniques that may be used to implement the disclosed solution are described below.

"Chemical mechanical polishing process" (CMP), also known as "planarization", refers to a process of smoothing surfaces with the combination of chemical and mechanical forces. It can be thought of as a hybrid of chemical etching and free abrasive polishing.

The process uses an abrasive and corrosive chemical slurry (commonly a colloid) in conjunction with a polishing pad and retaining ring, typically of a greater diameter than the wafer. The pad and wafer are pressed together by a dynamic polishing head and held in place by a plastic retaining ring.

The dynamic polishing head is rotated with different axes of rotation (i.e., not concentric). This removes material and tends to even out any irregular topography, making the wafer flat or planar.

CMP polishing and/or leveling may be done to set up the wafer for the formation of additional circuit elements. For example, CMP can bring the entire surface within the depth of field of a photolithography system, or selectively remove material based on its position. Typical depth-of-field requirements are down to Angstrom levels for the latest 22 nm technology. "Dielectric chemical mechanical polishing process" refers to a chemical mechanical polishing process adapted for removal and or polishing of layers of a dielectric. "Nickel monosilicide chemical mechanical polishing process" refers to a chemical mechanical polishing process adapted for removal and or polishing of layers of nickel monosilicide.

"Deposition" refers to a phase transition in which gas transforms into solid without passing through the liquid phase. Deposition is a thermodynamic process. The reverse of deposition is sublimation and hence sometimes deposition is called desublimation.

Deposition is one of many processes that may be used in microfabrication of an integrated semiconductor device or structure. Principles and mechanics of deposition are used in the manufacture or generation of thin film layers and/or structures and are referred to as thin film deposition. "Thin film deposition" refers to any technique for depositing a thin film of material onto a substrate or onto previously deposited layers. Examples of different types of thin film deposition include, but are not limited to, chemical deposition, physical deposition, epitaxy, and the like.

Examples of chemical deposition include chemical solution deposition (CSD) or chemical bath deposition (CBD), spin coating or spin casting, dip coating, chemical vapor deposition (CVD), plasma enhanced CVD (PECVD), atomic layer deposition (ALD), molecular vapor deposition (MLD), and the like. Examples of physical deposition include a thermal evaporator, molecular beam epitaxy (MBE), an electron beam evaporator, sputtering, pulsed laser deposition, cathodic arc deposition, electrohydrodynamic deposition, and the like. Embodiments claimed and described herein may use one or more current or future thin film deposition techniques to implement one or more of the process steps disclosed.

"Thin film" refers to a layer of material ranging from fractions of a nanometer (monolayer) to several micrometers in thickness. The controlled synthesis of materials as thin films (a process referred to as deposition) is a fundamental step in many applications such as the manufacture of patterned storage media, magnetic recording media, electronic semiconductor devices, Light Emitting Diodes LEDs, storage cells, and the like.

"Thickness" refers to a dimension for a structure (e.g. Integrated Circuit Semiconductor (ICS)), material layer, and/or thin film formed by way of a microfabrication process. As used herein, thickness refers to a measurement from a bottom of an ISC or thin film to a top of the ISC or thin film where the bottom and top run parallel to an X-axis of an X-Y coordinate axis and the thickness is measured parallel to the Y-axis.

"Etching" refers to one of many processes that may be used in microfabrication of an integrated semiconductor device or structure. Often, etching is used to selectively remove one material while leaving other materials mainly unchanged. In one embodiment, etching is used to chemically remove layers, such as a thin film, from a surface of a wafer during manufacturing.

Examples of etching include wet etching, dry etching, reactive ion etching, and plasma etching. Those of skill in the art will recognize these types of etching and how these types and future developed types may be used in connection with the disclosed solutions.

"Thermal solid-state reaction" refers to reactions performed in the absence of solvents by either grinding or melting the starting materials together or simply applying heat to a mixture of starting materials. This type of reaction is usually performed in order to obtain polycrystalline inorganic solids but may also be used in organic synthesis. Solid state reactions offer reduced costs, decreased amounts of chemical waste and, sometimes, an increase in yield.

FIG. 3A-FIG. 3D provide process cross-sectional wafer views 300. Process cross-sectional wafer views 300 depict steps that may be used in a manufacturing method, such as steps in microfabrication, to form a multi-layer electrode in accordance with one embodiment.

FIG. 3A depicts a process state after word line 302 formation on a substrate 212. A multi-layer electrode 304 can be formed directly on the substrate 212. Those of skill in the art will recognize that this multi-layer electrode 304 may be formed using one, or more, of the methods used for the bit line formation, as described below and claimed herein, so the description of word line 302 formation is omitted here for conciseness.

FIG. 3B depicts a process state in which a cell film stack 226 is formed above the word line 302 (also referred to as a word line layer). From the bottom up, the layers in place include the substrate 212, the multi-layer electrode 304 word line, carbon 216, ovonic threshold switch 218, carbon 220, Ge—Sb—Te 222, carbon 224, and top silicon layer (Si 306). "Top silicon layer" refers to a layer of silicon on top of a substrate, cell film stack, wafer, or the like. "Silicon layer" refers to a thin film layer of silicon. The cell film stack 226 is formed using similar microfabrication methods described in relation to FIG. 2. The Si 306 may be sputter deposited on to the carbon 224.

FIG. 3C depicts a process state after etching. The cell film stack 226 may be etched to form a plurality of pillars separated by trenches 230. Conventional etching techniques may be used to form the plurality of pillars and the associated trenches 230.

FIG. 3D depicts a process state after filling the trenches 230 with a dielectric, such as SiO 232 or SiO2. The dielectric may be deposited using convention deposition techniques to fill in the gaps (trenches) between the plurality of pillars. In one embodiment, the wafer may be planarized to expose the top silicon layer after dielectric deposition, and/or to remove protrusions of either dielectric or silicon, in order to form a smooth surface. In this manner, the Si 306 layer may become an exposed top silicon layer. "Exposed top silicon layer" refers to a top silicon layer that has been covered or coated in a prior process step or is currently covered or coated and is subsequently exposed by one or more of etching, selective material removal process, chemical mechanical polishing process, a mechanical polishing process, and/or the like. Each pillar may include an exposed top silicon layer.

Conventional chemical mechanical polishing processes may be used to planarize the wafer. "Protrusion" refers to a structure or portion of a structure that protrudes or extends from one other structure. Generally, the other structure is connected to the protrusion. A smooth surface may be desirable before the process continues in order to provide adequate contact between the exposed top silicon layer and subsequent layers, described below.

FIG. 4A-FIG. 4D and FIG. 5A-FIG. 5D provide process cross-sectional views 400 and process cross-sectional views 500, respectively for a process in accordance with a single embodiment. These process cross-sectional views depict steps (material at different stages) that may be used to form a multi-layer electrode in accordance with one embodiment. In this embodiment, two annealing steps may be performed, and a final planarization step may not be needed in the process. A final planarization step may be avoided by calculating thicknesses of the silicon layer and nickel layer (or other metal used for silicidation, such as a di-nickel silicide layer) such that the resulting multi-layer electrode is at a desired level and/or thickness. This is possible by leveraging a Gibbs' free energy change in the chemical reaction (thermal solid-state reaction) between the silicon layer, nickel layer, and the di-nickel silicide layer over the two step annealing formation process.

Gibbs free energy is a thermodynamic quantity that may be used to determine how one material will react with another during a thermal solid-state reaction under a constant temperature and pressure. In certain embodiments, a Gibbs free energy quantity is used to ensure that silicidation of nickel and silicon proceeds to a desired state (formation of di-nickel silicide ($Ni_2Si$)) and not an undesired state (formation of NiSi during a first or subsequent step of two annealing steps/stages). In the first annealing of a process described in relation to FIG. 4A-FIG. 4D and FIG. 5A-FIG. 5D, a di-nickel silicide ($Ni_2Si$) layer is formed by a thermal solid-state reaction between Si and Ni at about 260° C. "Di-nickel silicide layer" refers to a thin film of di-nickel silicide represented by the symbol $Ni_2Si$.

When forming a multi-layer electrode of nickel monosilicide and di-nickel silicide from a nickel layer and a silicon layer, it is desirable to form NiSi and $Ni_2Si$ 508 to serve as the multi-layer electrode and not nickel disilicide ($NiSi_2$) because nickel disilicide has higher resistance than NiSi and $Ni_2Si$ 508. In one embodiment, the $Ni_2Si$ 508 may have a thickness of between about 5 nanometers and about 10 nanometers. In such embodiments, the $Ni_2Si$ 508 is thin but still may provide a thermal barrier to one or more other layers of a multi-layer electrode during subsequent fabrication processes.

In an embodiment for forming a multi-layer electrode using two annealing steps, the predefined thickness of the material, predefined time period, and temperature for each annealing step are controlled to form di-nickel silicide ($Ni_2Si$) in the first annealing step while retaining some silicon and not permit the di-nickel silicide ($Ni_2Si$) to further react to form nickel monosilicide (NiSi) at this stage. In addition to controlling the temperature for a first annealing, the pressure, the time of exposure; the thickness of the nickel may be thick enough that unreacted nickel remains after the first annealing. Based on the Gibbs free energy change quantities for the reaction of the ratio of 2 atoms of Ni and one atom of Si to form $Ni_2Si$, a dominant product of this first silicidation phase (first annealing) is di-nickel silicide and a layer of unreacted nickel. This is because the Gibbs' free energy change of $Ni_2Si$ formation is smaller than that of NiSi, as shown in Table 1.

Accordingly, in one embodiment, the thickness of the Ni metal is controlled such that the Ni metal is not fully consumed at the first annealing, or some unreacted nickel remains on the $Ni_2Si$ after the first annealing. Having a layer of unreacted nickel is desirable.

TABLE 1

| Gibbs' free energy change (250-450° C.) | |
|---|---|
| Reaction | ΔG° kJ/mol |
| 2Ni + Si → $Ni_2Si$ | −136 to −135 |
| Ni + Si → NiSi | −88 |
| ½$Ni_2Si$ + ½Si → NiSi | −46 |

Figure 4A:
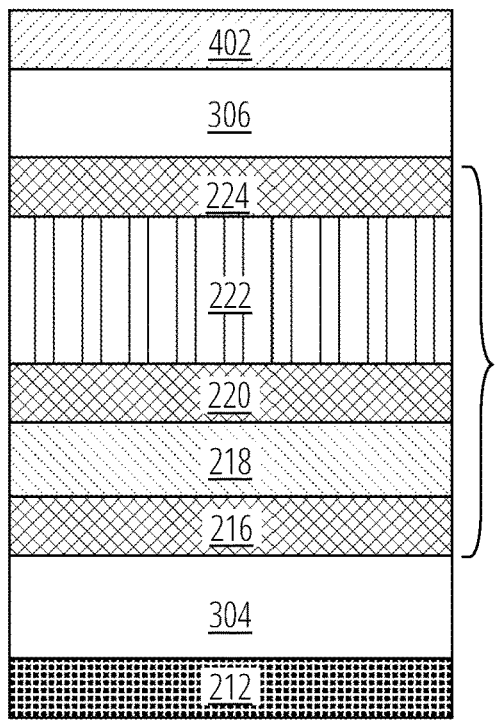
FIG. 4A-FIG. 4D depict process cross-sectional views 400 in accordance with one embodiment.

FIG. 4A depicts a process state after cell film stack 226 is deposited using a plurality of steps, as described in relation to FIG. 2. The cell film stack 226 may be deposited on a substrate 212, and may include a multi-layer electrode 304 layer that serves as a word line 206, a carbon 216 layer, an ovonic threshold switch 218 layer, a carbon 220 layer, a Ge—Sb—Te 222 layer, a carbon 224 layer, and a Si 306 layer that is a top silicon layer, as shown. A sacrificial layer 402 can be deposited onto the Si 306 layer. "Sacrificial layer" refers to a layer of material, typically a thin film, used in microfabrication to temporarily create one or more structures for certain steps of a microfabrication process. In certain embodiments, the sacrificial layer is temporary because once the microfabrication process completes the sacrificial layer has been removed or rendered inactive with respect to structures and/or devices formed in a microfabrication process. In one embodiment, the sacrificial layer 402 is an amorphous carbon.

Figure 4B:
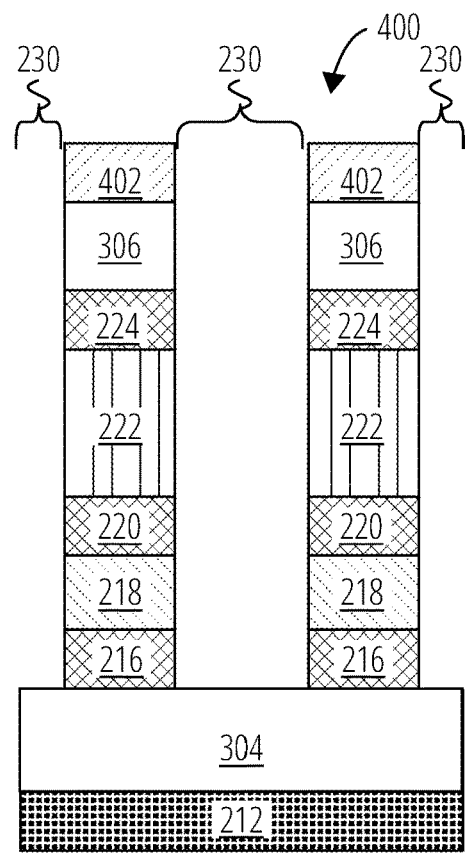
Figure 4C:
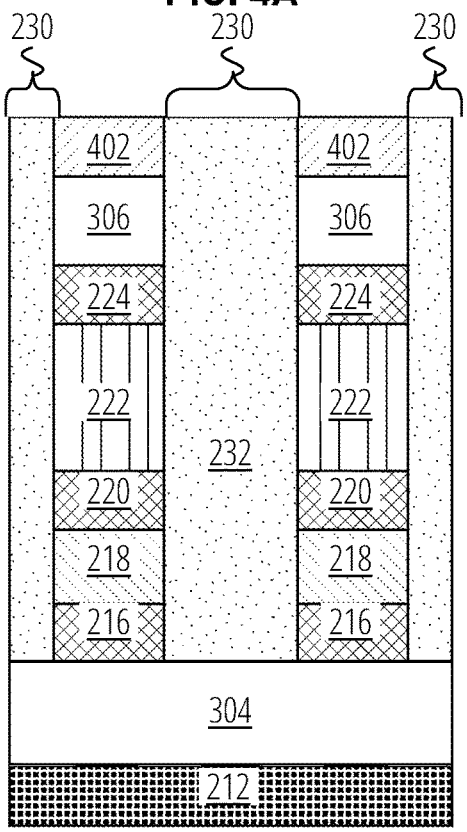

FIG. 4B depicts a process state after etching of trenches 230. The cell film stack and sacrificial layer 402 may be etched to form a plurality of pillars, as previously described with regard to FIG. 3C. FIG. 4C depicts a process state after deposition of a dielectric fill, such as SiO 232, which may be performed as described with regard to FIG. 3D. FIG. 4C depicts that, in one embodiment, the dielectric fill is deposited up to the same level as the sacrificial layer 402.

Figure 4D:
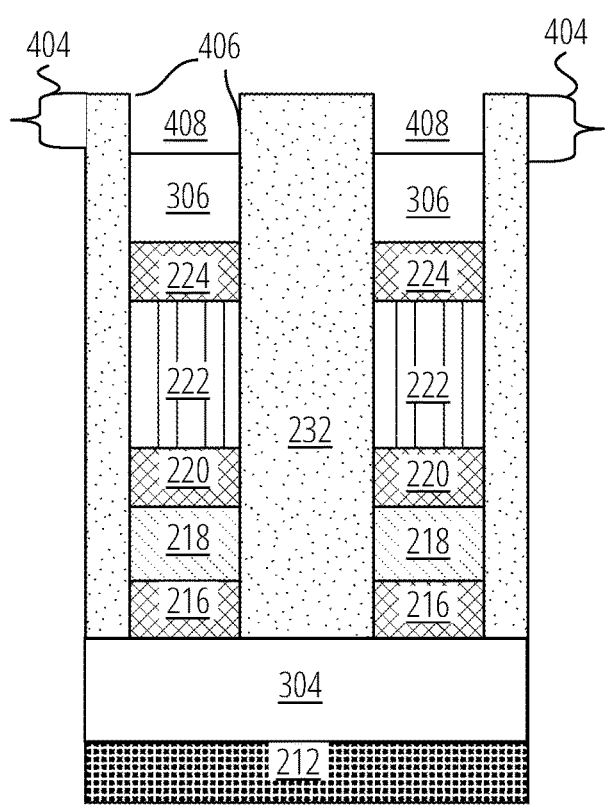

FIG. 4D depicts a process state after removal of the sacrificial layer. In some embodiments, a portion of the sacrificial layer 402 may be removed along with surrounding dielectric through planarization, in order to achieve a desired thickness or predefined thickness of a remaining sacrificial layer 402. The planarization step that reduces the thickness of the sacrificial layer 402 to a desired remaining thickness may also planarizes the dielectric fill, SiO 232.

The sacrificial layer 402 on top of each pillar can be removed through etching, leaving a portion of the dielectric protruding (dielectric protrusion 404) and forming at least two walls 406 that extend above each pillar. In certain embodiments, the dielectric and sacrificial layer 402 may not be planarized. Instead, the height/thickness of the dielectric protrusions 404 may be configured/designed to provide a desired sizing of a remaining gap 408 once the sacrificial layer 402 is removed.

In certain embodiments, formation of a multi-layer electrode may rely on managing an amount of silicon in the top silicon layer before a first annealing step. Thus, in one embodiment, the amount of silicon in the top silicon layer may be controlled, managed, or configured by managing a thickness of the top silicon layer during one or more of planarization after the dielectric fill (FIG. 4B) and removal of the sacrificial layer. For example, in one embodiment, removing the sacrificial layer may include etching the top silicon layer to a predefined thickness, or desired thickness, such that annealing a wafer or substrate for a second time period and at a second temperature causes a nickel monosilicide layer to consume a top silicon layer and form a cap layer. For example, in one embodiment, the Si 306 may be etched as part of removing the sacrificial layer 402 until the Si 306 is of a proper thickness that will be all consumed in a subsequent reaction between nickel and the top silicon layer (Si 306).

In certain embodiments, it is desirable to consume all, or substantially all, of the top silicon layer during a second silicidation step so that the silicon is not present to further react with a nickel monosilicide layer formed below the cap layer. This may be desirable to mitigate the possibility of a di-nickel silicide cap layer reacting with a nickel monosilicide to form nickel disilicide ($NiSi_2$).

Alternatively, or in addition, in certain embodiments, the amount (which may be controlled using the thickness) of silicon Si 306 deposited before adding the sacrificial layer 402 may be controlled such that annealing the substrate for the second time period and at the second temperature causes the nickel monosilicide layer to absorb the top silicon layer and form the cap layer. In certain embodiments, all the silicon Si 306 is absorbed. In another embodiment, the multi-layer electrode may include a cap layer, a nickel monosilicide and a remainder silicon layer. In such an embodiment, the amount of silicon Si 306 may be controlled to ensure that a remainder silicon layer is present after a second annealing of the substrate. In other words, the remainder silicon layer is not consumed by the nickel monosilicide. "Remainder silicon layer" refers to an amount of silicon film, remaining after a selective material removal process and/or a silicidation process.

Figure 5A:
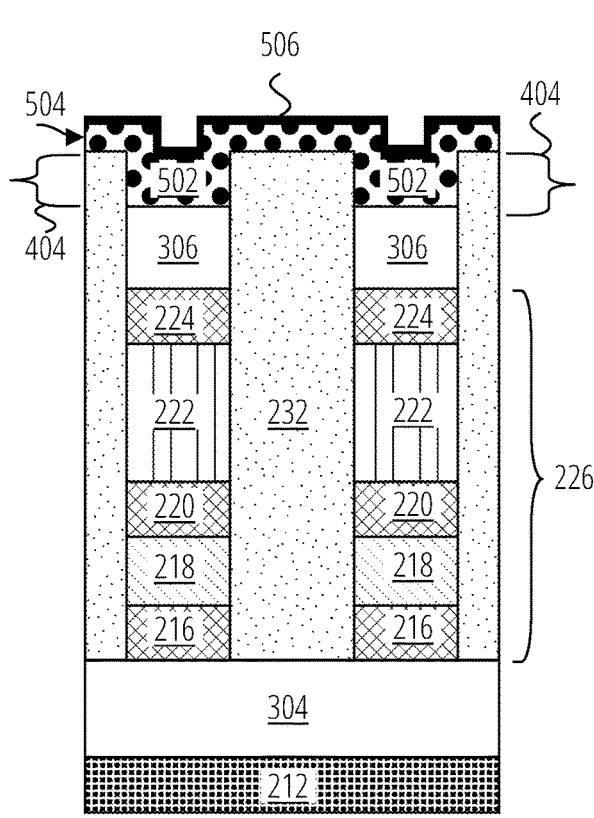
FIG. 5A-FIG. 5D depict process cross-sectional views 500 in accordance with the embodiment of FIG. 4A-FIG. 4D.

FIG. 5A depicts a process state after nickel deposition. Ni 502 may be deposited onto the wafer to form a nickel layer 504. This nickel layer 504 may cover the dielectric protrusions 404 and the Si 306 surface, top silicon layer, as shown, leaving dips where the nickel layer rests directly on the top silicon layer, within the gaps 408. "Nickel layer" refers to a thin film of nickel. In one embodiment, the nickel layer covers the exposed top silicon layer and is deposited to a predefined thickness. A thickness of the nickel layer 504 may be predefined such that the layers of a resulting multi-layer electrode 518 have desired thicknesses.

In one embodiment, the top silicon layer Si 306 is about 0.817 times a thickness of the multi-layer electrode 518 and the nickel layer 504 is about 0.446 times the thickness of the multi-layer electrode; and the di-nickel silicide layer $Ni_2Si$ 508 is 0.678 times the thickness of the multi-layer electrode and wherein the di-nickel silicide layer reacts with a portion of the top silicon layer that is 0.409 times the thickness of the multi-layer electrode. More details relating to the relative thicknesses of the nickel layer, silicon layer, di-nickel silicide layer, and nickel monosilicide are described in greater detail with regard to FIGS. 8A-D. "Nickel monosilicide layer" refers to a thin film of nickel monosilicide. "Nickel monosilicide" refers to a monosilicide that includes a single nickel atom per molecule or unit cell of silicon. Nickel monosilicide is represented by the symbol NiSi.

In certain embodiments, a thin titanium nitride layer (TiN 506) can be deposited on the nickel layer. The titanium nitride layer 506 may have a thickness of between about 10 nanometers and about 20 nanometers. The titanium nitride layer 506 may serve to prevent oxidation of the nickel with oxygen the wafer may be exposed to during a fabrication process. Surface oxidation of the nickel is undesirable because such oxidation may disturb the thermal solid-state reaction of nickel layer (Ni 502) and the silicon layer (Si 306) during the silicidation (e.g., annealing).

Figure 5B:
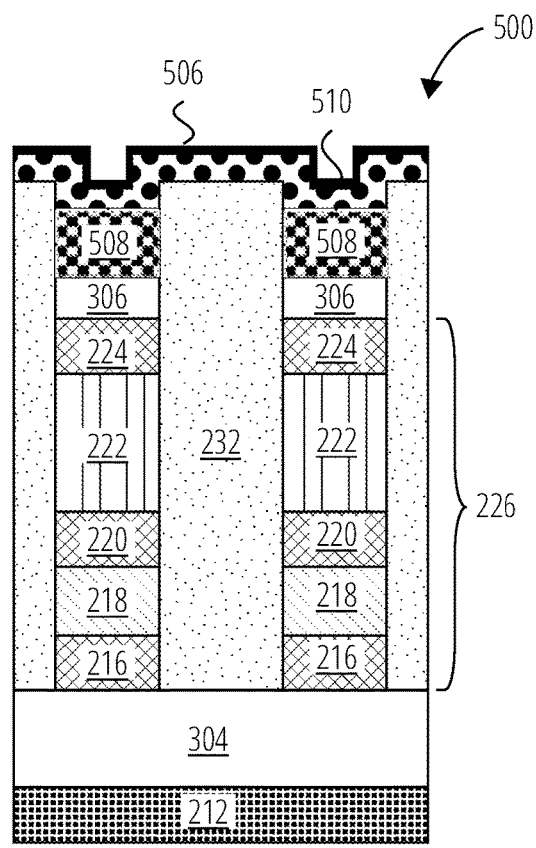

FIG. 5B depicts a process state after a first silicidation step, a first annealing. This annealing step may be performed by raising the temperature of the wafer to a first temperature for a first time period. In one embodiment, the first temperature is between about 100° C. and about 350° C. and the first time period is greater than two minutes. The nickel Ni 502 in the nickel layer 504 reacts through a thermal solid-state reaction with the Si 306 of the top silicon layer to form a di-nickel silicide layer ($Ni_2Si$ 508) above the top silicon layer. In certain embodiments, annealing the top silicon layer and the nickel layer may convert at least a portion of the silicon layer into the di-nickel silicide layer.

The remaining silicon layer forms a remainder silicon layer. In certain embodiments, the remainder silicon layer is designed to have a thickness that facilitates formation of di-nickel silicide ($Ni_2Si$ 508) in the presences of nickel layer 504, but is completely absorbed in a subsequent reaction between the di-nickel silicide ($Ni_2Si$ 508) and the remainder silicon layer (Si 306). Having a limited supply of silicon in the remainder silicon layer may help to ensure a remainder di-nickel silicide layer and a nickel monosilicide will exist after a second annealing (described below in relation to FIG. 5D).

"Thermal solid-state reaction" refers to reactions performed in the absence of solvents by either grinding or melting the starting materials together or simply applying heat to a mixture of starting materials. This type of reaction is usually performed in order to obtain polycrystalline inorganic solids but may also be used in organic synthesis. Solid state reactions offer reduced costs, decreased amounts of chemical waste and, sometimes, an increase in yield.

In one embodiment, the thickness of the nickel layer 504 is controlled such that during the first annealing the Ni 502 and Si 306 react to form only $Ni_2Si$ 508 (and not nickel monosilicide during this step or nickel disilicide ($NiSi_2$)). For example, a thickness of the nickel layer 504 may be greater than needed from a chemical reaction design perspective to ensure that $Ni_2Si$ 508 is formed and not nickel disilicide. In one embodiment, the first temperature and first time period are set and controlled such that a remainder silicon layer (Si 306) remains after the first annealing operation.

In certain embodiments, the top silicon layer and the nickel layer can be annealed for a predefined time period, such as first time period. The first time period may vary depending on the thickness of the nickel layer, the desired thickness for the di-nickel silicide layer, the desired thickness of the silicon layer, the silicon diffusivity [$nm^2/s$], and the nickel diffusivity [$nm^2/s$]. Those of skill in the art recognize and understand how to account for these variables to set a first time period for the silicidation. In one embodiment, the first time period for silicidation of the top silicon layer, Si 306, and the nickel layer, Ni 502 is between about 1.5 and about 2 minutes.

A predefined thickness for the nickel layer 504 and first temperature and first time period can be configured such that the di-nickel silicide layer ($Ni_2Si$ 508) reaches a predefined thickness, leaving a desired portion/thickness of the top silicon layer (Si 306), as well as a layer of unreacted nickel 510. "Layer of unreacted nickel" refers to a thin film of nickel that did not diffuse or react with adjacent materials during a thermal reaction process.

Figure 5C:
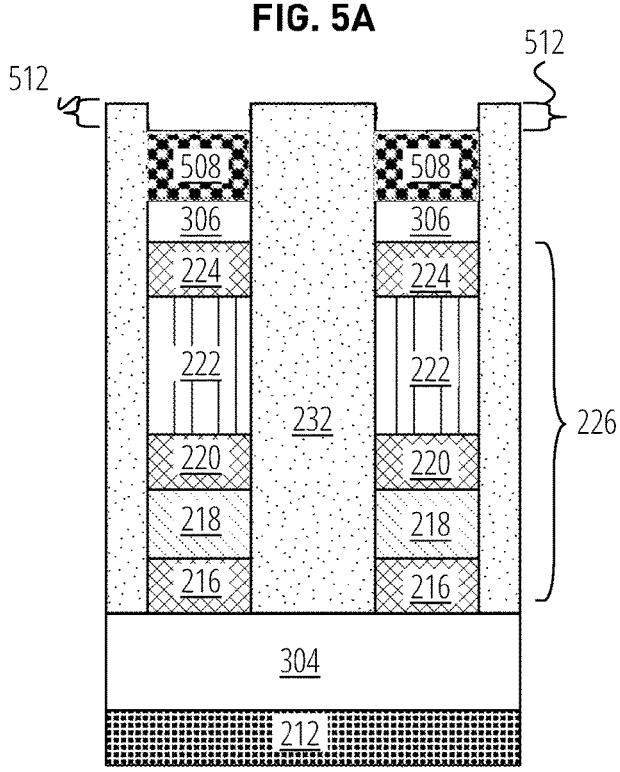

FIG. 5C depicts a process state after nickel removal. The layer of unreacted nickel 510 may be removed through wet etching. In embodiments with a titanium nitride layer 506, the wet etching may also be used to remove the titanium nitride layer 506. As a result, the Ni$_2$Si 508 layer may be exposed for the next step of the process.

In certain embodiments, removal of the layer of unreacted nickel 510 using wet etching is done such that substantially all nickel of the layer of unreacted nickel 510 is removed. In this manner, no more nickel is available for subsequent reactions between the Ni$_2$Si 508 and Si 306. Removing all the nickel provides a greater degree of control of subsequent reactions between the Ni$_2$Si 508 and Si 306.

Figure 5D:
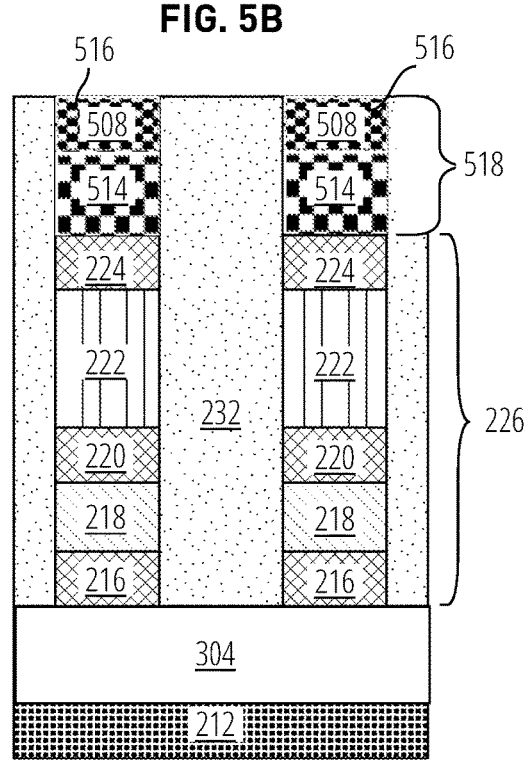

FIG. 5D depicts a process state after a second silicidation of the wafer, second annealing step. This second silicidation step may be performed by raising the temperature to a second temperature for a second time period. In one embodiment, the second time period is shorter than a first time period for an annealing step that forms a di-nickel silicide layer above the top silicon layer Si 306. In one embodiment, the first time period may be at least 2 minutes and the second time period may be less than about 1.5 minutes.

At the second temperature, based on the Gibbs' free energy change of the silicidation reaction, and in the absence of additional free, unreacted nickel, the second annealing step causes the di-nickel silicide layer (Ni$_2$Si 508) and the remaining silicon (Si 306) to react to form a nickel monosilicide layer 514 between a cap layer 516 of di-nickel silicide (Ni$_2$Si 508) and the cell film stack 226 (i.e., the carbon 224 layer of the cell film stack 226). The nickel monosilicide layer 514 and cap layer 516 together form a multi-layer electrode 518. In one embodiment, the remainder silicon layer (Si 306) is sized such that there is a limited supply of silicon for the reaction with the di-nickel silicide layer (Ni$_2$Si 508) such that a cap layer 516 of di-nickel silicide (Ni$_2$Si 508) will remain and not all of the di-nickel silicide layer (Ni$_2$Si 508) will change into the nickel monosilicide layer 514. In addition, limiting the amount of silicon (Si 306) also minimizes a rick that the second annealing step may form nickel disilicide (NiSi$_2$).

In one embodiment, the second temperature may be less than a first temperature for a first annealing step that forms a di-nickel silicide layer above the top silicon layer Si 306 (See FIG. 5B). In another embodiment, the second temperature is between about 375° Celsius and about 325° Celsius.

In one embodiment, the second annealing step may anneal the wafer to form the nickel monosilicide layer by raising a temperature of the wafer to the second temperature of about 350 degrees Celsius such that a portion of the di-nickel silicide layer reacts with the top silicon layer to form the nickel monosilicide layer between the cap layer and the cell film stack. The cap layer includes a remainder of the di-nickel silicide layer.

In one embodiment, the cap layer 516 is made of di-nickel silicide (Ni$_2$Si 508) and may serve to shield the nickel monosilicide layer 514 from further exposure to increased temperatures, thermal exposure, as the wafer experiences additional semiconductor fabrication process steps. In certain embodiments, formation or fabrication of a multi-layer electrode can include a restriction, requirement, or constraint for subsequent fabrication process steps that involve the multi-layer electrode. As shown in FIG. 5D, the multi-layer electrode 518 can include a cap layer of di-nickel silicide (i.e., remainder di-nickel silicide layer) and a nickel monosilicide layer 514.

The cap layer and nickel monosilicide layer 514 could react thermally during subsequent fabrication process steps that involve the multi-layer electrode. These subsequent thermal reactions could produce nickel disilicide (NiSi$_2$) which has a higher resistivity than di-nickel silicide or nickel monosilicide. Thus, to avoid formation of nickel disilicide (NiSi$_2$), subsequent semiconductor fabrication steps with a wafer that includes the multi-layer electrode 518 maintain an exposure temperature for the wafer below about 350° Celsius, and, in certain embodiments, below about 300° Celsius. In this manner, further reaction between the cap layer and the di-nickel silicide layer can be mitigated or prevented. In addition, keeping the exposure temperature below about 350° Celsius or about 300° Celsius may mitigate or prevent agglomeration of the nickel monosilicide and/or the di-nickel silicide cap layer of the multi-layer electrode.

In some embodiments, such as the one depicted, silicidation and removal of remaining unreacted nickel may result in a dielectric protrusions 512 above the surface of the wafer. These dielectric protrusions 512 may necessitate planarization. In other embodiments, planarization may not be needed at this stage in the process.

Where planarization is used, the planarization may remove the dielectric protrusions 512, leaving a smooth wafer surface. In one embodiment, planarization comprises applying a nickel mono-silicide chemical mechanical polishing process to the wafer. In another embodiment, planarization comprises depositing a dielectric film onto the di-nickel silicide layer, applying a dielectric chemical mechanical polishing process to the wafer, then planarizing the wafer to remove the remaining protrusion "Dielectric film" refers to a thin film of a dielectric.

Because molecules of the Ni$_2$Si 508 and nickel monosilicide layer 514 coalesce into configurations with consistent dimensions, the ratios of Ni and Si deposited, the temperatures at which annealing is performed, and the length of time during which silicidation is allowed to occur may be closely controlled to form a nickel monosilicide layer 514 and di-nickel silicide layer (Ni$_2$Si 508) that together grow in thickness to become even with the wafer surface (even with the dielectric, SiO 232), and may thus require no additional planarization, as shown.

In certain embodiments, the ratios of Ni 502 and Si 306 deposited, the temperatures at which a second annealing is performed, and the length of time during which silicidation is allowed to occur may be closely controlled to form a nickel monosilicide layer 514 and a di-nickel silicide layer (Ni$_2$Si 508) and not form a nickel di-silicide (NiSi$_2$) layer.

Nickel di-silicide (NiSi$_2$) has a greater resistance than nickel monosilicide or di-nickel silicide. The resistance for nickel di-silicide, NiSi$_2$, is about 50 µΩcm, while the resistance for di-nickel silicide, Ni$_2$Si, is about 25 µΩcm, and the resistance for nickel monosilicide, NiSi, is about 15 µΩcm. Thus, embodiments of the claimed processes and structures are configured to avoid forming nickel di-silicide, NiSi$_2$ by forming exclusively di-nickel silicide, Ni$_2$Si, during the first annealing, by for example ensuring that a layer of unreacted nickel 510 remains after the first annealing, leveraging the Gibbs free energy change quantity differences for the reactions.

FIG. 4A-FIG. 4D and FIG. 5A-FIG. 5D depict multiple views of a wafer throughout a process of forming a multi-layer electrode for an integrated semiconductor. The process steps provide a mechanism for forming a durable, thin, low resistance multi-layer electrode of a nickel monosilicide and a cap layer. In certain embodiments, the multi-layer electrode serves as a bit line, in other embodiments the multi-layer electrode may serve as a word line or other control line for a non-volatile memory array.

In one embodiment of a method of forming a multi-layer electrode, a top silicon layer is converted into a multi-layer electrode having no remainder silicon layer. In such an embodiment, a nickel monosilicide layer may substantially replace the top silicon layer. In other embodiments, a di-nickel silicide layer may consume most of the top silicon layer and still leave some remainder silicon layer between the nickel monosilicide and a substrate or cell film stack.

Figure 6:
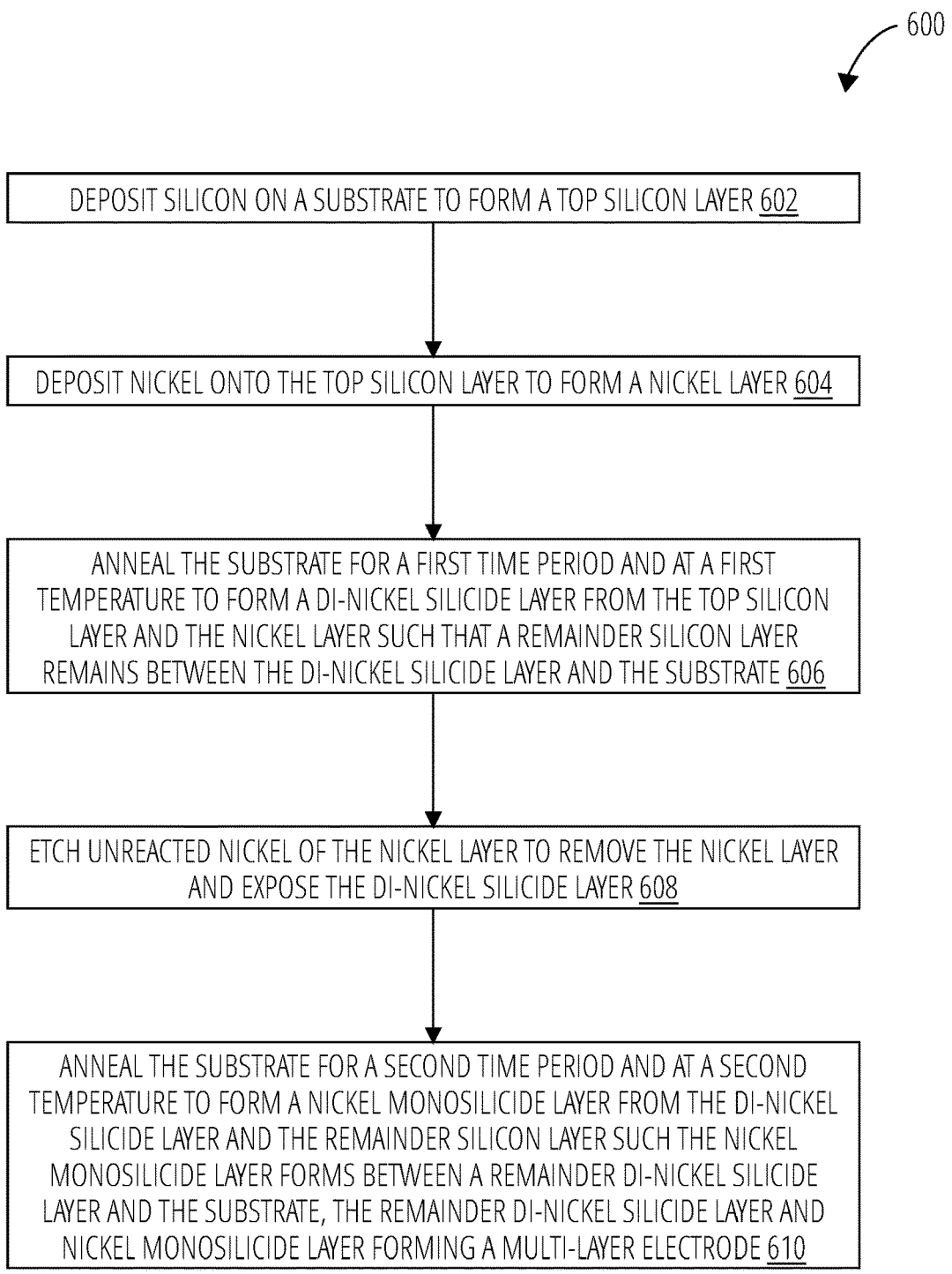
FIG. 6 depicts a routine 600 in accordance with one embodiment.

FIG. 6 depicts a method for forming a multi-layer electrode on a substrate. FIG. 7A-FIG. 7D depict process cross-sectional views 700 during stages of routine 600.

In block 602, routine 600 deposits silicon (Si 702) on a substrate 704 to form a top silicon layer. In block 604, routine 600 deposits nickel (Ni 706) onto the top silicon layer (Si 702) to form a nickel layer 708. FIG. 7A depicts a process cross-sectional view of the substrate 704 after deposition of the nickel layer 708. Prior process steps may form the walls of dielectric SiO 232. The dielectric walls may include dielectric protrusions 404. This nickel layer 708 may cover the dielectric protrusions 404 and the Si 702 surface, top silicon layer, as shown, leaving dips where the nickel layer rests directly on the top silicon layer, within gaps. In one embodiment, the nickel layer 708 covers the exposed top silicon layer and is deposited to a predefined thickness. A thickness of the nickel layer 708 and/or silicon layer Si 702 may be predefined, configured, arranged, and/or designed such that the layers of a resulting multi-layer electrode 720 have desired thicknesses.

In certain embodiments, a thin titanium nitride layer (TiN 710) can be deposited on the nickel layer 708. The titanium nitride layer (TiN 710) may have a thickness of between about 10 nanometers and about 20 nanometers. The titanium nitride layer (TiN 710) may serve to prevent oxidation of the nickel with oxygen the substrate may be exposed to during a fabrication process. Surface oxidation of the nickel is undesirable because such oxidation may disturb the thermal solid-state reaction of nickel layer (Ni 706) and the silicon layer (Si 702) during the silicidation (e.g., annealing).

Referring back to FIG. 6, in block 606, routine 600 anneals (also known as a first annealing) the substrate 704 for a first time period and at a first temperature to form a di-nickel silicide layer (Ni$_2$Si 712) from the top silicon layer (Si 702), or at least a portion of the top silicon layer (Si 702), and the nickel layer 708 such that a remainder silicon layer (Si 702) remains between the di-nickel silicide layer (Ni$_2$Si 712) and the substrate 704.

FIG. 7B depicts a process cross-sectional view after the first silicidation step, block 606, a first annealing. This annealing step, block 606, may be performed by raising the temperature of the substrate 704 to a first temperature for a first time period. In one embodiment, the first temperature is between about 100° C. and about 350° C. and the first time period is greater than two minutes. The nickel layer 708 reacts through a thermal solid-state reaction with the Si 702 of the top silicon layer to form a di-nickel silicide layer (Ni$_2$Si 712) above the top silicon layer Si 702. In certain embodiments, annealing the top silicon layer Si 702 and the nickel layer Ni 706 may convert at least a portion of the silicon layer into a di-nickel silicide layer Ni$_2$Si 712.

Referring back to FIG. 6, in block 608, routine 600 etches unreacted nickel (e.g., layer of unreacted nickel 714) of the nickel layer 708 to remove the nickel layer 708, or substantially all of the nickel layer 708, and expose the di-nickel silicide layer (Ni$_2$Si 712).

FIG. 7C depicts a process cross-sectional view after unreacted nickel removal. The layer of unreacted nickel 714 may be removed through wet etching. In embodiments with a titanium nitride layer 710, the wet etching may also be used to remove the titanium nitride layer 710. As a result, the di-nickel silicide layer Ni$_2$Si 712 may be exposed for the next step of the process.

In some embodiments, such as the one depicted, silicidation and removal of remaining unreacted nickel may result in a dielectric protrusions 404 above the surface of the substrate 212. These dielectric protrusions 404 (if there are the protrusions even after the formation of the multi-layer electrode) may necessitate planarization. In other embodiments, planarization may not be needed at this stage in the process.

Where planarization is used, the planarization may remove the dielectric protrusions 404, leaving a smooth surface. In one embodiment, planarization comprises depositing a dielectric film onto the di-nickel silicide layer Ni$_2$Si 712, applying a dielectric chemical mechanical polishing process to the surface, then planarizing the surface to remove the remaining protrusion.

Referring back to FIG. 6, in block 610, routine 600 anneals (also known as a second annealing) the substrate for a second time period and at a second temperature to form a nickel monosilicide layer 716 from the di-nickel silicide layer (Ni$_2$Si 712) and the remainder silicon layer (Si 702) such that the nickel monosilicide layer 716 forms between a remainder di-nickel silicide layer (Ni$_2$Si 712) and the substrate, the remainder di-nickel silicide layer and nickel monosilicide layer together form a multi-layer electrode 720. In one embodiment, the multi-layer electrode 720 include 5% di-nickel silicide (Ni$_2$Si 712) and 95% nickel monosilicide. In certain embodiments, the substrate 704 may comprise, a cell film stack. The multi-layer electrode 720 may have a resistance between about 2.5 mega-ohms per centimeter and about 0.6 mega-ohms per centimeter.

FIG. 7D depicts a process state after the second silicidation, block 610, of the substrate 704, second annealing step. This second silicidation may be performed by raising the temperature to a second temperature for a second time period. In one embodiment, the second time period for block 610 is shorter than the first time period for block 606. In one embodiment, the second time period may be between 1 minute and about 1.5 minutes. In one embodiment, the second temperature for block 610 is less than the first temperature for block 606. In one embodiment, the second temperature may be between about 375° Celsius and about 325° Celsius. In one embodiment, the second temperature is about 350° Celsius.

Certain embodiments of the claimed solution may be adapted to control the reaction of di-nickel silicide (Ni$_2$Si 712) and silicon (Si 702), to avoid excess annealing. Excess annealing may be problematic if the annealing leads to agglomeration of grains within a nickel monosilicide layer 716 of the multi-layer electrode 720. Agglomeration of grains within a nickel monosilicide layer 716 may increase resistance within a final multi-layer electrode 720. Embodiments of the claimed solution may avoid or mitigate grain agglomeration by configuring layer thicknesses, predefined temperatures, and predefined time periods.

In certain embodiments, formation or fabrication of a multi-layer electrode may include a restriction, requirement, or constraint for subsequent fabrication process steps that involve the multi-layer electrode. Referring back to FIG. 6, in certain embodiments, routine 600 may also include a block (not shown) or step of performing one or more subsequent semiconductor fabrication steps with the multi-layer electrode 720 wherein an exposure temperature for the multi-layer electrode remains ≤about 350° Celsius. By keeping the exposure temperature to ≤about 350° Celsius further reaction between the cap layer 718 and nickel monosilicide layer 716 can be mitigated or prevented.

The cap layer and nickel monosilicide layer 716 could react thermally during subsequent fabrication process steps that involve the multi-layer electrode 720. These subsequent thermal reactions could produce nickel disilicide (NiSi$_2$) which has a higher resistivity than di-nickel silicide or nickel monosilicide. Thus, to avoid formation of nickel disilicide (NiSi$_2$), subsequent semiconductor fabrication steps with a wafer that includes the multi-layer electrode 720 maintain an exposure temperature for the wafer below about 350° Celsius. In this manner, further reaction between the cap layer and the di-nickel silicide layer can be mitigated or prevented.

Referring to FIG. 6, in certain embodiments, the ratios of Ni 706 and Si 702 deposited, the temperatures at which a second annealing is performed, and the length of time during which a second silicidation is allowed to occur may be closely controlled to form a nickel monosilicide layer 514 and a di-nickel silicide layer (Ni$_2$Si 508) and not form a nickel di-silicide (NiSi$_2$) layer.

Figure 7E:
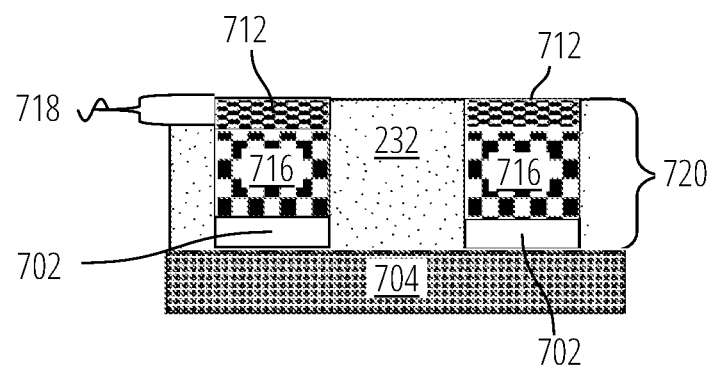
FIG. 7E depicts an aspect of the subject matter in accordance with one embodiment.

FIG. 7E depicts a process state in an alternative embodiment after the second silicidation of the substrate 704, second annealing step (block 610). This second silicidation may be performed by raising the temperature to a second temperature for a second time period which causes a nickel monosilicide layer 716 to form between the remainder silicon layer (Si 702) and the remainder di-nickel silicide layer (Ni$_2$Si 712), such that the remainder di-nickel silicide layer (Ni$_2$Si 712), the nickel monosilicide layer 716, and the remainder silicon layer (Si 702) form the multi-layer electrode 720. In this embodiment, the remainder silicon layer is not consumed by the nickel monosilicide layer and remains.

In this embodiment, the remainder di-nickel silicide layer (Ni$_2$Si 712) may serve as the cap layer 718. By leaving the remainder silicon layer (Si 702), the thermal solid-state reaction has more silicon to use in the reaction and this may help mitigate, or prevent, agglomeration, particularly as agglomeration may be a result of annealing.

In certain embodiments, such as those depicted in relation to FIG. 7C and FIG. 7D, the amount, such as thickness of the top silicon layer is configured, designed, or engineered such that annealing the substrate for the second time period and at the second temperature causes the nickel monosilicide layer 716 to consume the top silicon layer (Si 702) and form the remainder di-nickel silicide layer (Ni$_2$Si 712). In another embodiment, the top silicon layer is configured (e.g., of a predefined thickness) such that annealing the substrate for the second time period and at the second temperature causes the nickel monosilicide layer 716 to absorb the top silicon layer (Si 702).

In other embodiments, such as those depicted in relation to FIG. 7E, the amount, such as thickness of the top silicon layer is configured, designed, or engineered such that annealing the substrate for the second time period, and at the second temperature causes formation of the nickel monosilicide layer 716 between the remainder di-nickel silicide layer (Ni$_2$Si 712) and the top silicon layer (Si 702). Some, but not all, of the top silicon layer (Si 702) may react to form the nickel monosilicide layer and still leave a remainder silicon layer. In such an embodiment, the cap layer 718 of Ni$_2$Si 712 is thin and provides a thermal barrier to prevent or mitigate further reaction between the nickel monosilicide layer 716 and remainder silicon layer (Si 702) during subsequent fabrication processes.

FIG. 8A-FIG. 8B depict thickness ratios for thin film layers for forming a low resistance multi-layer electrode. These ratios may allow silicidation through double annealing as described with regard to FIG. 4A-FIG. 4D and FIG. 5A-FIG. 5D to result in an even surface with no need for planarization. This is possible based on the ratios described in Table 2 below.

TABLE 2

Thickness relation of elements and silicides

| Phase | Density (Mg/m$^3$) | R1 | R2 |
|---|---|---|---|
| Ni | 8.91 | — | — |
| Ni$_2$Si | 7.27 | 1.52 | 0.915 |
| NiSi | 5.95 | 2.21 | 1.83 |
| Si | 2.33 | — | — |

R1: Ratio of silicide thickness to deposited nickel metal film thickness.

R2: Ratio of reacted silicon thickness to deposited nickel metal film thickness.

In this embodiment, a final multi-layer electrode of di-nickel silicide layer (Ni$_2$Si 508) and nickel monosilicide layer 514 having a certain thickness is desired. That thickness may be expressed as a unit measure, or "1", for the purpose of determining the relative thicknesses that may be needed for the silicon layer and the nickel layer.

In FIG. 8A, a layer of silicon (Si 306) may be deposited that is 0.817 times the desired final multi-layer electrode thickness of 1. Based on the R2 value for NiSi in Table 2, the thickness of the Ni 502 layer needed may be determined through Equations 1 through 3.

$$\frac{\text{Si thickness}}{\text{Ni thickness}} = R2 \text{ for NiSi} = 1.83 \quad \text{EQUATION 1}$$

$$\text{Ni thickness} = \frac{\text{Si thickness}}{1.83} = \frac{0.817}{1.83} \quad \text{EQUATION 2}$$

$$\text{Ni thickness} = 0.446 \quad \text{EQUATION 3}$$

Thus, in FIG. 8B, a nickel layer (Ni 502) of thickness 0.446 may be deposited. The total thickness of the deposited layers may therefore be 1.263 (Si thickness+Ni thickness) times the desired finished thickness of the nickel monosilicide layer 514.

FIG. 8C depicts a process state after a first annealing at around 350° C. This annealing may be performed for a first time period calculated to allow substantially all of the nickel to be consumed into the reaction, forming the Ni$_2$Si 508 layer. The ratios in Table 2 for Ni$_2$Si may be used to determine the thickness of the resulting Ni$_2$Si 508 layer using Equations 4 through 6.

$$\frac{\text{Ni}_2\text{Si thickness}}{\text{Ni thickness}} = R1 \text{ for Ni}_2\text{Si} = 1.52 \quad \text{EQUATION 4}$$

$$\text{Ni}_2\text{Si thickness} = 1.52 \times \text{Ni thickness} = 1.52 \times 0.446 \quad \text{EQUATION 5}$$

$$\text{Ni}_2\text{Si thickness} = 0.678 \quad \text{EQUATION 6}$$

Similarly, the silicon layer thickness for the second annealing may be determined through Equations 7 through 9.

$$\frac{\text{Si thickness}}{\text{Ni thickness}} = R2 \text{ for Ni}_2\text{Si} = 0.915 \quad \text{EQUATION 7}$$

-continued $$\text{Si thickness} = 0.915 \times \text{Ni thickness} = 0.915 \times 0.446 \quad \text{EQUATION 8}$$

$$\text{Si thickness} = 0.408 \quad \text{EQUATION 9}$$

Note that the Si thickness resulting in Equation 9 is the thickness that is to be consumed by the reaction in the second annealing. FIG. 8D depicts a finished process state after a second annealing at about 350° C. This annealing may be performed for a predefined time period calculated to allow substantially all of the remaining silicon to be consumed into the reaction, forming a nickel monosilicide layer 514 having a di-nickel silicide cap layer 516. That the thickness of this final layer is about "1" as desired may be shown through Equations 10 through 12.

$$\frac{\text{Si thickness}}{\text{Ni thickness}} = R1 \text{ for NiSi} = 2.21 \quad \text{EQUATION 10}$$

$$\text{NiSi thickness} = 2.21 \times \text{Ni thickness} = 2.21 \times 0.446 \quad \text{EQUATION 11}$$

$$\text{NiSi thickness} = 0.986 \quad \text{EQUATION 12}$$

(Some rounding error may be incurred when calculating with decimals rounded as presented above. More exact calculations may be performed to come within acceptable tolerances of layer thicknesses.)

Figure 9:
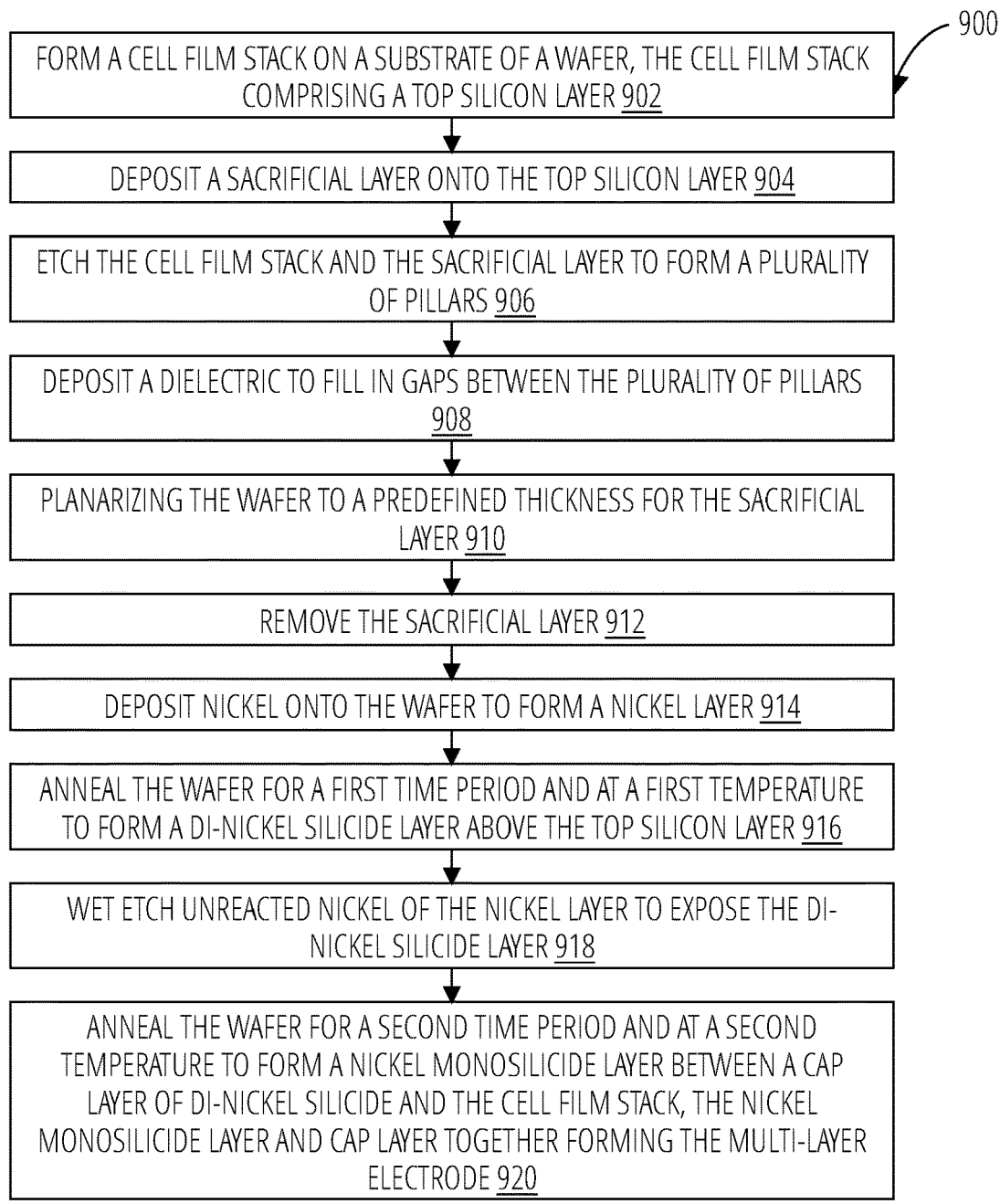
FIG. 9 depicts a routine 900 in accordance with one embodiment.

FIG. 9 depicts a method of making a low resistance multi-layer electrode in accordance with one embodiment. This method begins at block 902 with formation of a cell film stack on a substrate of a wafer, the cell film stack comprising a top silicon layer. In block 904, routine 900 deposits a sacrificial layer onto the top silicon layer.

In block 906, etching the cell film stack and the sacrificial layer forms a plurality of pillars. In block 908, routine 900 deposits a dielectric to fill in gaps between the plurality of pillars left by the etching. In block 910, planarizing the wafer yields a sacrificial layer of a predefined thickness. Having a predefined thickness for the sacrificial layer may be desirable such that when the sacrificial layer is removed a thickness of the top silicon layer is also reduced, for example by the same etching of the sacrificial layer or another etching step, such that the top silicon layer has a desired thickness for subsequent steps. In block 912, routine 900 removes the sacrificial layer.

In block 914, routine 900 deposits nickel onto the wafer to form a nickel layer. In block 916, routine 900 anneals the wafer for a first time period and at a first temperature to form a di-nickel silicide layer above the top silicon layer. In block 918, routine 900 wet etches unreacted nickel of the nickel layer to expose the di-nickel silicide layer. In one embodiment, block 918 removes all of the unreacted nickel.

In block 920, routine 900 anneals the wafer for a second time period and at a second temperature to form a nickel monosilicide layer between a cap layer of di-nickel silicide and the cell film stack, the nickel monosilicide layer and cap layer together forming the multi-layer electrode. In block 920 with a supply of silicon (Si 306) and the nickel removed (unreacted nickel) the nickel monosilicide with a cap layer of di-nickel silicide. Advantageously, the presence of a di-nickel silicide layer after block 920 provides an indication that a sufficient amount of annealing was done without doing excess annealing. Thus, the formation of the di-nickel silicide on top of nickel monosilicide may serve as a guide that sufficient annealing has been done but not so much annealing that agglomeration of the nickel monosilicide has occurred.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing or industry tolerance for a given application. In one embodiment, the acceptable manufacturing tolerance is ±0.25% of a given dimension.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc., are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

What is claimed is:

1. A method of forming a multi-layer electrode, comprising:
   depositing silicon on a substrate to form a top silicon layer;
   depositing nickel onto the top silicon layer to form a nickel layer;
   annealing the substrate for a first time period and at a first temperature to form a di-nickel silicide layer from the top silicon layer and the nickel layer such that a remainder silicon layer remains between the di-nickel silicide layer and the substrate;
   etching unreacted nickel of the nickel layer to remove the nickel layer and expose the di-nickel silicide layer; and
   annealing the substrate for a second time period and at a second temperature to form a nickel monosilicide layer from the di-nickel silicide layer and the remainder silicon layer such that the nickel monosilicide layer forms between a remainder di-nickel silicide layer and the substrate, the remainder di-nickel silicide layer and nickel monosilicide layer forming a multi-layer electrode.

2. The method of claim 1, wherein the second time period is less than the first time period and the second temperature is less than the first temperature.

3. The method of claim 2, wherein the second time period is between about 1 minute and about 1.5 minutes and the second temperature is between about 375° Celsius and about 325° Celsius.

4. The method of claim 3, wherein the second temperature is about 350° Celsius.

5. The method of claim 1, wherein the top silicon layer is configured such that annealing the substrate for the second time period and at the second temperature causes the nickel monosilicide layer to consume the top silicon layer and form the remainder di-nickel silicide layer.

6. The method of claim 1, wherein the multi-layer electrode comprises about 95% nickel monosilicide and about 5% di-nickel silicide and wherein the substrate comprises a cell film stack.

7. The method of claim 1, wherein the top silicon layer is configured such that annealing the substrate for the second time period and at the second temperature causes the nickel monosilicide layer to form between the remainder silicon layer and the remainder di-nickel silicide layer such that the remainder di-nickel silicide layer, the nickel monosilicide layer, and the remainder silicon layer form the multi-layer electrode, wherein the remainder silicon layer is not consumed by the nickel monosilicide layer.

8. The method of claim 1, further comprising:
   performing one or more semiconductor fabrication steps with the multi-layer electrode wherein an exposure temperature for the multi-layer electrode remains ≤about 350° Celsius.

9. A method of forming a multi-layer electrode, comprising:
   forming a cell film stack on a substrate of a wafer, the cell film stack comprising a top silicon layer;
   depositing a sacrificial layer onto the top silicon layer;
   etching the cell film stack and the sacrificial layer to form a plurality of pillars;
   depositing a dielectric to fill in gaps between the plurality of pillars;
   planarizing the wafer to a predefined thickness for the sacrificial layer;
   removing the sacrificial layer;
   depositing nickel onto the wafer to form a nickel layer;
   annealing the wafer for a first time period and at a first temperature to form a di-nickel silicide layer above the top silicon layer;
   wet etching unreacted nickel of the nickel layer to expose the di-nickel silicide layer; and
   annealing the wafer for a second time period and at a second temperature to form a nickel monosilicide layer between a cap layer of di-nickel silicide and the cell film stack, the nickel monosilicide layer and cap layer together forming the multi-layer electrode.

10. The method of claim 9, wherein the second time period is shorter than the first time period and wherein annealing the wafer to form the nickel monosilicide layer comprises raising a temperature of the wafer to the second temperature of about 350 degrees Celsius such that a portion of the di-nickel silicide layer reacts with the top silicon layer to form the nickel monosilicide layer between the cap layer and the cell film stack, the cap layer comprising a remainder of the di-nickel silicide layer.

11. The method of claim 9, wherein the second temperature is between about 375° Celsius and about 325° Celsius.

12. The method of claim 9, wherein the first time period comprises at least 2 minutes and the second time period comprises less than 1.5 minutes.

13. The method of claim 9, wherein the top silicon layer is configured such that annealing the wafer for the second time period and at the second temperature causes the nickel monosilicide layer to absorb the top silicon layer and form the cap layer.

14. The method of claim 9, wherein removing the sacrificial layer further comprises:
   etching the top silicon layer to a thickness such that annealing the wafer for the second time period and at the second temperature causes the nickel monosilicide layer to consume the top silicon layer and form the cap layer.

15. The method of claim 9, wherein the top silicon layer is about 0.817 times a thickness of the multi-layer electrode and the nickel layer is about 0.446 times the thickness of the multi-layer electrode and the di-nickel silicide layer is 0.678 times the thickness of the multi-layer electrode and wherein the di-nickel silicide layer reacts with a portion of the top silicon layer that is 0.409 times the thickness of the multi-layer electrode.

16. The method of claim 9, wherein subsequent semiconductor fabrication steps with the wafer having the multi-layer electrode maintain an exposure temperature for the wafer below about 350° Celsius.

17. A method comprising:
providing a phase change memory device comprising a selector, a phase change storage cell connected in series to the selector, a word line connected in series to the selector, and a bit line connected in series to the phase change storage cell, wherein one or more of the bit line and the word line comprise a multi-layer electrode; and
forming the multi-layer electrode by a thermal solid-state reaction process comprising:
  depositing a silicon layer on a substrate;
  etching a plurality of pillars in the silicon layer wherein the silicon layer forms a top silicon layer;
  forming a trench having at least two walls and a bottom comprising the top silicon layer;
  depositing nickel over the trench;
  annealing the nickel and the top silicon layer for a first time period and at a first temperature to form a di-nickel silicide layer between the nickel and the top silicon layer by way of a thermal solid-state reaction;
  wet etching unreacted nickel of the nickel layer to expose the di-nickel silicide layer and remove the unreacted nickel; and
  annealing the di-nickel silicide layer and the top silicon layer for a second time period and at a second temperature to form a nickel monosilicide layer between the di-nickel silicide layer and the substrate, the nickel monosilicide layer and the di-nickel silicide layer forming the multi-layer electrode.

18. The method of claim 17, wherein:
the second time period is less than the first time period and the second temperature is less than the first temperature; and
wherein the nickel monosilicide layer absorbs the top silicon layer.

19. The method of claim 17, wherein the multi-layer electrode has a resistance between about 2.5 mega-ohms per centimeter and about 0.6 mega-ohms per centimeter.

* * * * *